United States Patent
Grayson et al.

(10) Patent No.: US 10,529,674 B2
(45) Date of Patent: Jan. 7, 2020

(54) SYSTEM AND METHOD FOR STRIPLINE ELECTRODES FOR THIN-FILM CHARACTERIZATION

(71) Applicant: Northwestern University, Evanston, IL (US)

(72) Inventors: Matthew Grayson, Evanston, IL (US); Yang Tang, Evanston, IL (US)

(73) Assignee: Northwestern University, Evanston, IL (US)

( * ) Notice: Subject to any disclaimer, the term of this patent is extended or adjusted under 35 U.S.C. 154(b) by 20 days.

(21) Appl. No.: 15/823,933

(22) Filed: Nov. 28, 2017

(65) Prior Publication Data

US 2018/0151515 A1 May 31, 2018

Related U.S. Application Data

(60) Provisional application No. 62/427,048, filed on Nov. 28, 2016.

(51) Int. Cl.
| | |
|---|---|
| *H01L 23/58* | (2006.01) |
| *H05K 3/32* | (2006.01) |
| *G01R 1/067* | (2006.01) |
| *H01L 23/52* | (2006.01) |
| *H01L 21/66* | (2006.01) |
| *G01R 15/20* | (2006.01) |
| *G01R 27/14* | (2006.01) |
| *G01R 31/28* | (2006.01) |

(52) U.S. Cl.
CPC ........ *H01L 23/585* (2013.01); *G01R 1/06755* (2013.01); *G01R 1/06777* (2013.01); *G01R 15/20* (2013.01); *G01R 27/14* (2013.01); *G01R 31/2831* (2013.01); *H01L 22/34* (2013.01); *H01L 23/52* (2013.01); *H05K 3/323* (2013.01); *H01L 22/14* (2013.01); *H01L 2924/0002* (2013.01)

(58) Field of Classification Search
CPC ....... H01L 23/585; H01L 22/34; H01L 23/52; H01L 22/14; H01L 2924/0002; G01R 1/06755; G01R 1/06777; H05K 3/323
USPC .......................................... 333/33
See application file for complete search history.

(56) References Cited

U.S. PATENT DOCUMENTS

| | | | | |
|---|---|---|---|---|
| 5,795,629 A | * | 8/1998 | Harada | ............ G02F 1/133711 252/299.01 |
| 9,235,075 B2 | * | 1/2016 | Montbach | ........... G02F 1/13718 |

(Continued)

OTHER PUBLICATIONS

Pixel table of Desktop LCD Display Comparison by Prismo, Copyright@ Prismo, Dec. 30, 2010, pp. 1 (Year: 2010).*

(Continued)

*Primary Examiner* — Benny T Lee
*Assistant Examiner* — Hafizur Rahman
(74) *Attorney, Agent, or Firm* — Benesch, Friedlander, Coplan & Aronoff LLP

(57) ABSTRACT

Systems and methods provide a device for characterizing a thin film, including a conducting or insulating substrate, an active layer on the conducting or insulating substrate to be characterized, and a plurality of stripline electrodes on the active layer. The plurality of stripline electrodes include a pitch width of a same order as the thickness of the active layer and strip width smaller than the thickness of the active layer.

19 Claims, 14 Drawing Sheets

(56) References Cited

U.S. PATENT DOCUMENTS

2004/0113160 A1* 6/2004 Oshima .................. H01S 5/028
257/82
2007/0252829 A1* 11/2007 Kobashi ............... G09G 3/3406
345/204
2017/0153514 A1* 6/2017 Tsung .................. G02F 1/0045

OTHER PUBLICATIONS

Stone, Edward, J.,"Liquid Crystal Display (LCD)", www.madehow. com, first published Jan. 29, 2006, section titled, "Applying the polymer". (Year: 2006).*

DeLair et al., "Electrical Insulators", Edison Tech Center, copyright 2014, bottom Figure on p. 4, section entitled: "Modern Wire Insulation". (Year: 2014).*

Geyer, R. "Dielectric characterization and reference materials", NIST Technical Note 1338, Boulder, CO, Apr. 1990, pp. 18. (Year: 1990).*

Fernandez et al.,"Dynannic Modeling of Liquid Crystal Display Cells using a Constant Charge Approach", paper No. 198, IEEE Transactions on Magnetics, Apr. 2002, paper No. 198, pp. 1-5. (Year: 2002).*

Zhou et al., "Thermal conductivity tensors of the cladding and active layers of antimonide infrared lasers and detectors", Optical materials Express, pp. 1632-1640, Optical Society of America, 2013 (Year: 2013).*

G.A. Umana-Membreno, et al.; "Vertical Minority Carrier Electron Transport in P-Type InAs/GaSb Type-II Superlattices," Applied Physics Letter, 101(25): 253515, 2012; 5 pages.

Yang Tang, et al.; "Magnetotransport Potentials for Anisotropic Thin Films with Stripline and Ground Place Contacts," Proc. SPIE 9370, 93700L-2, Feb. 8, 2015; 12 pages.

* cited by examiner

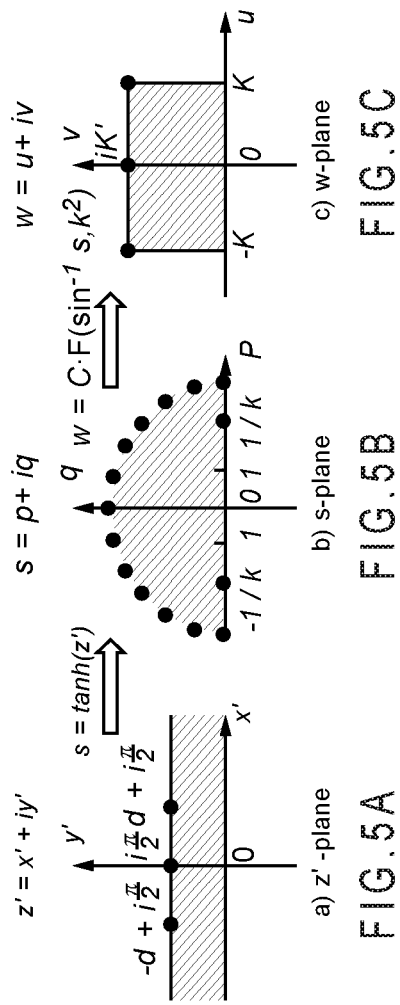
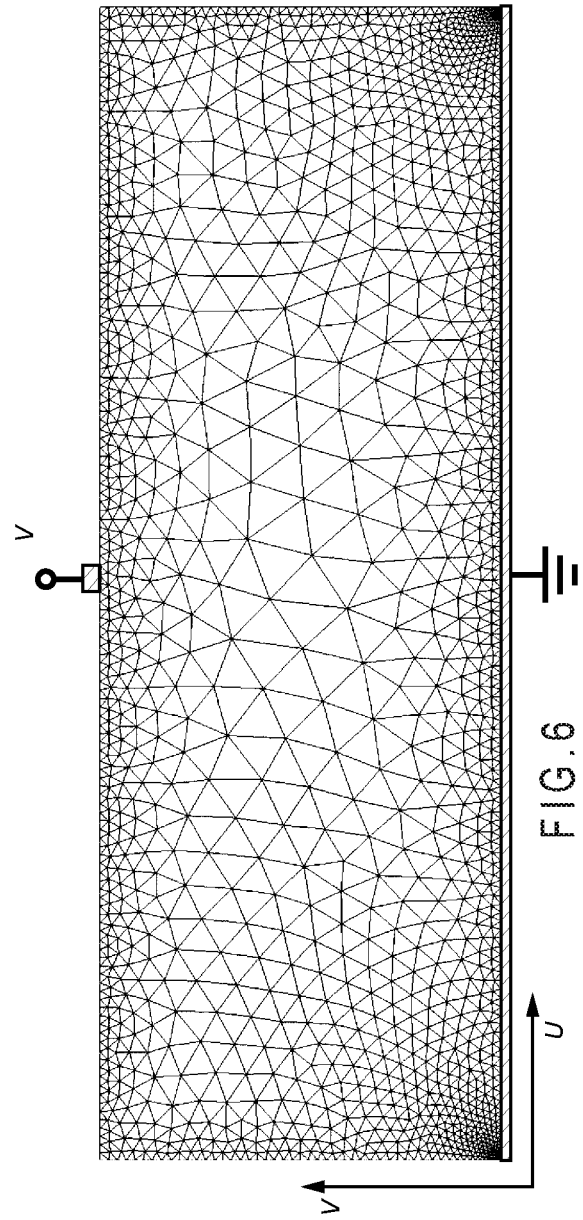

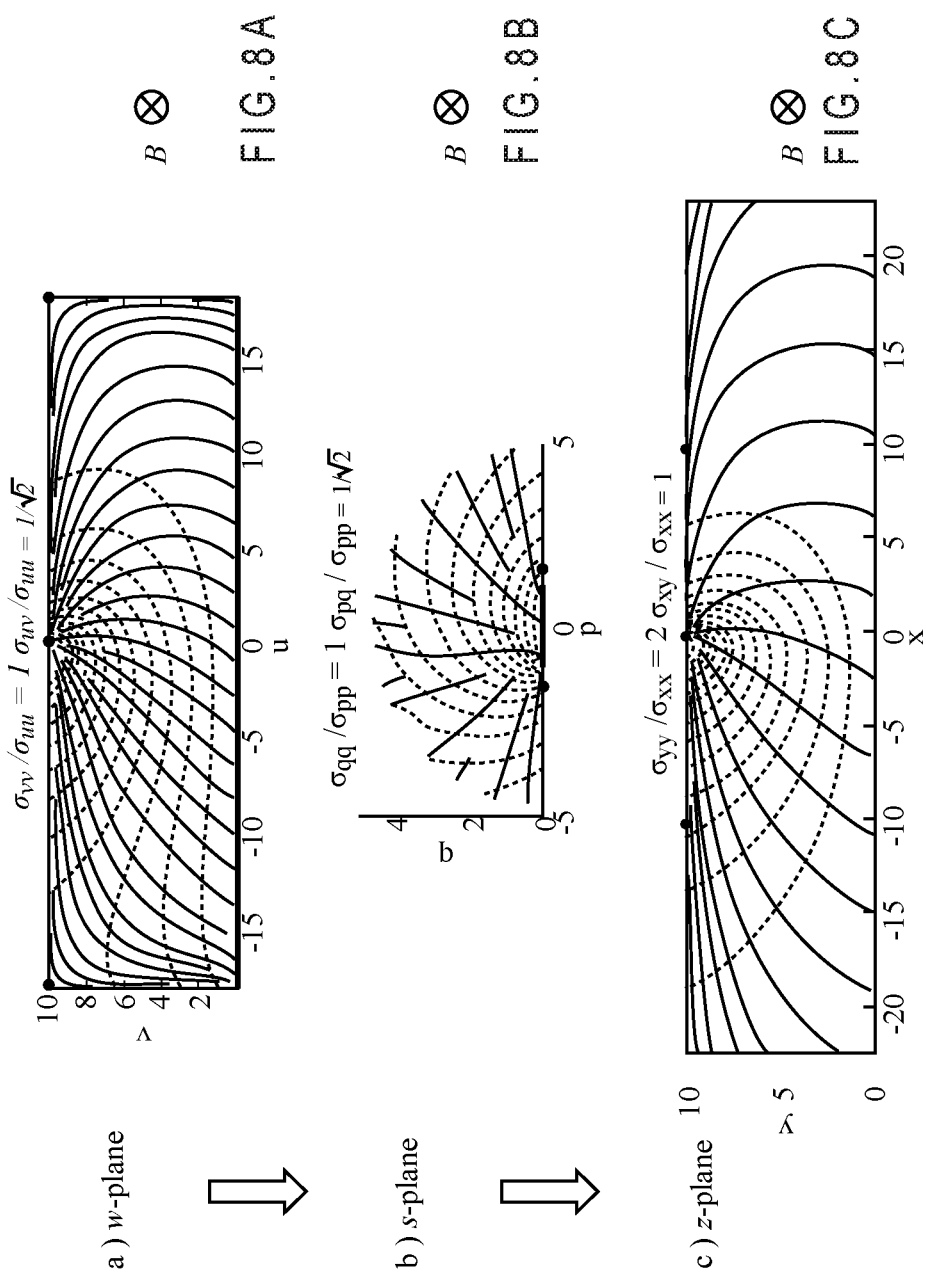

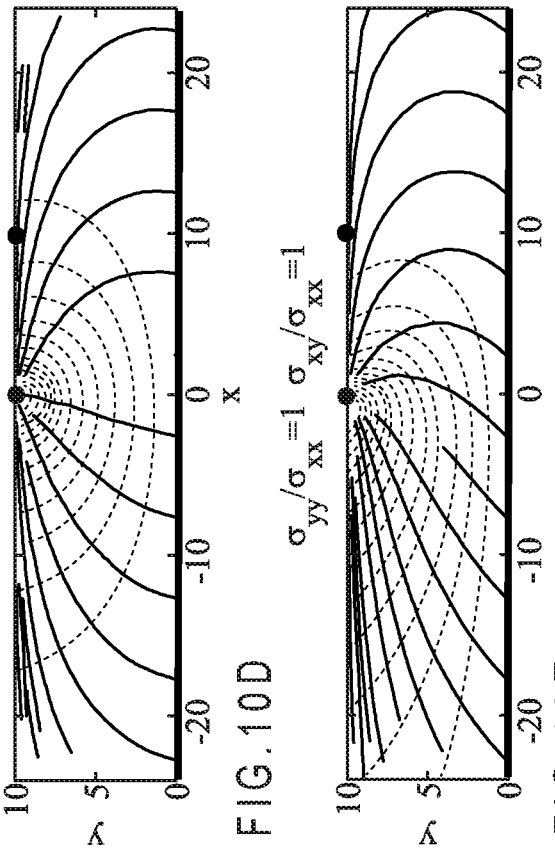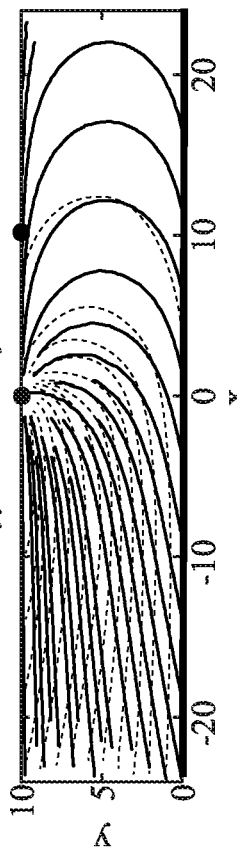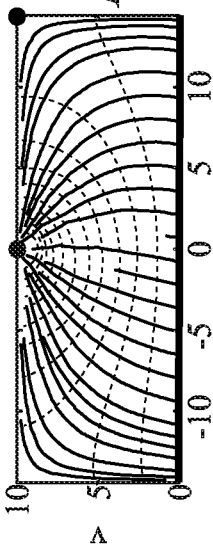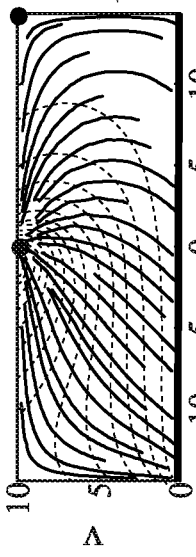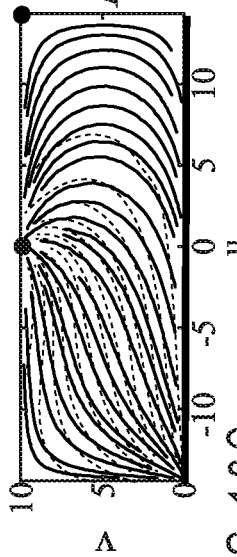

SYSTEM AND METHOD FOR STRIPLINE ELECTRODES FOR THIN-FILM CHARACTERIZATION

CROSS-REFERENCE TO RELATED APPLICATIONS

This patent application claims the benefit of U.S. Provisional Patent Application No. 62/427,048, filed on Nov. 28, 2016, the entire contents of which is incorporated by reference in its entirety.

STATEMENT OF FEDERALLY FUNDED RESEARCH

This invention was made with government support under FA9550-15-1-0247 and FA9550-15-1-0377 awarded by the Air Force Office of Scientific Research. The government has certain rights in the invention.

FIELD

Semiconductor thin-film characterization of anisotropic conductivity for electronic devices.

BACKGROUND

A way to measure conductivity and carrier density of thin films atop conducing substrate is to grow a test structure with the active layer of interest on top of a different, insulating substrate, thereby eliminating the short-circuit caused by the conducting substrate. This can be problematic because the lattice constant of the conducting substrate (e.g. GaSb) can be different from the lattice constant of the insulating substrate (e.g. GaAs). The strain and defect density of the test structure are different from that of the actual device. This alters the properties of the material and can make it problematic to try to deduce any useful conclusions about device improvements. Another approach, the Four-point probe method, can measure out-of-plane conductivity with a pseudo-4-point geometry, but does not measure in-plane and off-diagonal conductivity or carrier density.

BRIEF DESCRIPTION OF DRAWINGS

Features, objects and advantages other than those set forth above will become more readily apparent when consideration is given to the detailed description below. Such detailed description makes reference to the following drawings.

FIGS. 5A-C are graphs of example conformal maps transforming the infinite strip from z'-plane (FIG. 5A) to upper half s-plane (FIG. 5B), to a finite rectangle in the w-plane (FIG. 5C).

FIG. 6 is a graph of example triangle meshes generated in the finite rectangle in w-plane for a finite element method (FEM) simulation.

FIGS. 8A-C are graphs of example potential distribution and current flux density of the finite rectangle in the w-plane (FIG. 8A), the upper-half s-plane (FIG. 8B) and the infinitely wide stripe in the z-plane (FIG. 8C).

FIGS. 10A-F are graphs of example FEM-determined potential distribution for the case of an infinite strip with isotropic conductivity (A=1) is plotted for various magnetic field strengths.

DESCRIPTION

Many electronic and optoelectronic devices, e.g., semiconductor lasers, photosensors, photoemitters and camera focal-plane arrays and camera focal-plane arrays, can require a highly conducting or insulating substrate beneath the electrically active layer. Although this conducting or insulating substrate is used for device operation, it can be unfortunately problematic for device characterization since it short-circuits any in-plane voltage that is needed to characterize the electrically active layer of interest. Parameters of the active layer that require characterization can include the cross-plane conductivity, the in-plane conductivity, and the charge carrier density, e.g., while the layer of interest is in contact with the functionally necessary conducting or insulating substrate, which makes the characterization challenging.

In one aspect, a system and/or method allows all three parameters of interest, in-plane, cross-plane conductivities, and charge carrier density, to be characterized. In some examples, the system and/or method provides that linear contacts, called "striplines," be deposited atop the active layer, and the conducting or insulating substrate to act as a fourth grounding contact. By conducting different measurements using these contacts, the parameters of interest can be uniquely determined. The measurement technique can include theoretical calculations of the electrostatic potential distribution in the layer of interest that use scaling transformations, conformal mapping, and finite-element methods. Example applications include characterization of anisotropic conductivity of thin films, semiconductor superlattices, optoelectronics, lasers, focal plane arrays, etc.

Figure 1:
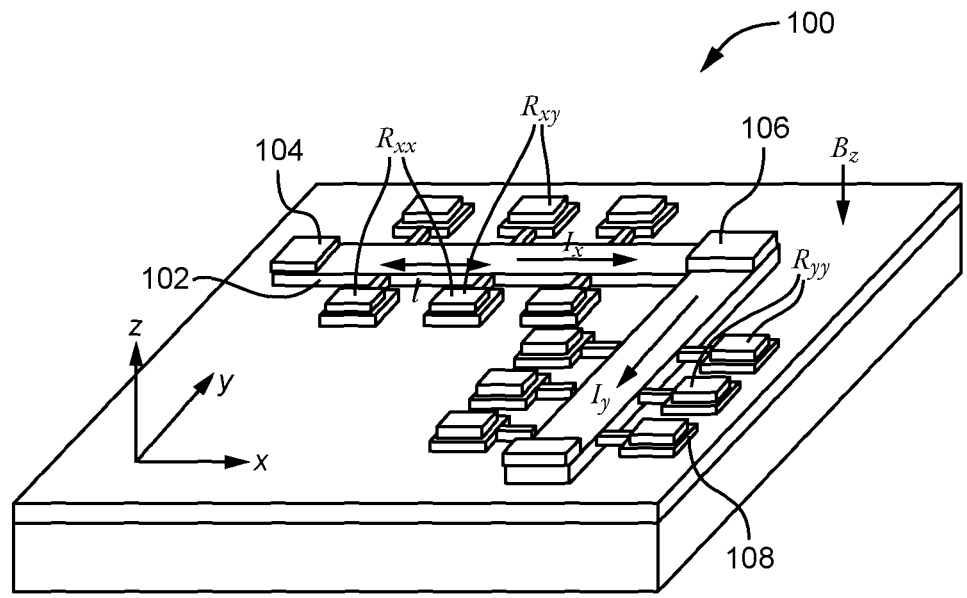
FIG. 1 is a schematic of an example device for measuring in-plane anisotropy.

FIG. 1 is a schematic of an example state-of-the-art measuring device for in-plane anisotropy 100. An L-shape Hall bar 102 in the x-y plane in the presence of a magnetic field $B_z$. The currents $I_x$ and $I_y$ are applied along the principal axis directions x and y, respectively. The longitudinal resistances along two directions $R_{xx}$ and $R_{yy}$ are measured with two voltage contacts along the bar, and the Hall resistance $R_{xy}$ is measured with two voltage contacts across the bar 102. Two resistivity components can be extracted from the measured resistances: $\rho_{xx}=R_{xx}A/l$ and $\rho_{xy}=R_{xy}d$, where A and d are the bar cross-section area and thickness, respectively. The 2D conductivity tensor can be obtained by inverting the resistivity tensor ($\sigma=\rho^{-1}$). To extract the full 3D tensor, at least three Hall bars 102 are used for 3D aligned materials, and at least two Hall bars 102 are used for 2D materials. For 2D materials a second bar 108 can be combined with the first bar 102, e.g., at an orthogonal angle, to make an L-shaped Hall bar. The Hall bar method is potentially imprecise due to the difficulty of accurately measuring the geometric factor 11A.

Alternatively, methods using planar samples may be adopted to extract the tensor components for 2D or 3D materials. One method is the van der Pauw (vdP) method which is used in electrical characterization. This method accepts planar samples or arbitrary shape and uses four point-like contacts on the sample periphery. For anisotropic samples, additional requirements are posed on the sample geometry and enough information can be obtained to extract the full in-plane conductivity tensor. The literature on vdP method for anisotropic materials are limited, and most studies use rectangular samples with principal axes aligned with the rectangle edges or with non-standard measurement geometries. Recently the anisotropic vdP method has been extended to parallelogram shaped samples with both known or unknown principal axis orientation. To extract the full tensor, the anisotropic vdP method uses three samples for 3D aligned materials, but only one sample for 2D materials. Also, the accuracy is higher than the Hall bar method since the measurement geometry-induced error is much smaller.

Figure 2:
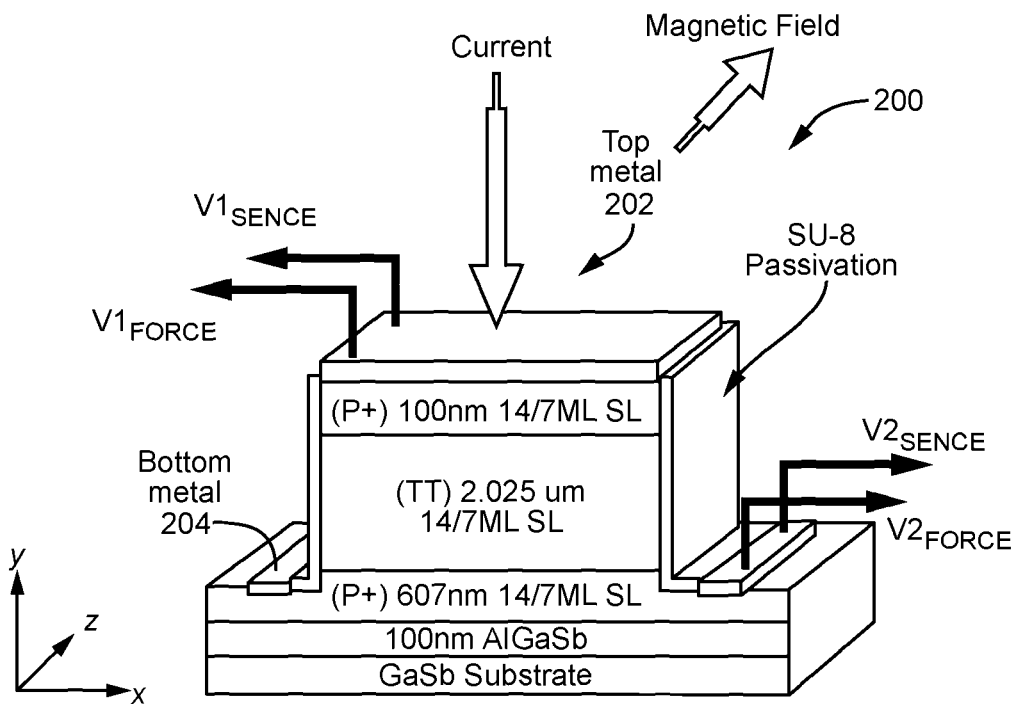
FIG. 2 is a schematic of an example device for measuring cross-plane anisotropy.

FIG. 2 is a schematic of an example device 200 for measuring cross-plane anisotropy. The vertical magnetoresistance measurement of p-type InAs/GaSb type-II superlattices is only able to measure one component of the resistivity tensor, and is not rigorously able to measure the Hall effect, rendering the characterization incomplete. This measurement method is only able to extract the longitudinal component of the resistivity tensor $\rho_{yy}$, and the other two components $\rho_{xx}$ and $\rho_{xy}$ are missing, which reduces the reliability and accuracy of the extraction of the conductivity tensor, carrier density, and mobilities. While the conductivity tensor for bulk anisotropic conductors can be characterized with the Hall bar method and the van der Pauw method, the characterization of anisotropic thin films can be more challenging, for both in-plane and cross-plane anisotropic conductivities. An obstacle to the in-plane conductivity characterization is the parallel conduction of the substrate. For anisotropic thin films grown on top of a conductive substrate, e.g. the active layer of optical devices, the highly conductive substrate will short-circuit any standard in-plane transport characterization that may be attempted at macroscopic scales. Current in-plane transport characterization of such structures either requires additional effort in removing the bottom conductive layer with precise mechanical or chemical approaches, low temperatures where the bottom conductive layer freezes out, or fabrication of the anisotropic thin film on another conducting or insulating substrate, where the transport properties can be different from the native performance in the original device due to lattice mismatch.

The cross-plane conductivity tensor characterization for anisotropic thin films can be even more challenging than in-plane direction. The film thickness is typically too small to allow any patterning in the vertical direction, as would be required to implement any of the characterization methods above. In practice, there are many electronic and optoelectronic devices with this sort of anisotropic layer, typically a superlattice, e.g., for photodetectors, lasers and transistors, etc. One technique to characterize the vertical transport properties of materials includes using a vertical bar structure of FIG. 2. The longitudinal component of the resistivity tensor $\rho_{yy}(B)$ can be extracted from the magneto-resistance measurement. The Hall voltage is short-circuited by the facet contacts 202, 204 on the top and bottom of the structure 200. No information about the off-diagonal tensor components can be extracted. The lack of the off-diagonal components of the conductivity tensor can reduce the reliability and accuracy of the calculation, and eliminate the possibility of deducing other transport parameters such as mobility and carrier density.

Figure 3A:
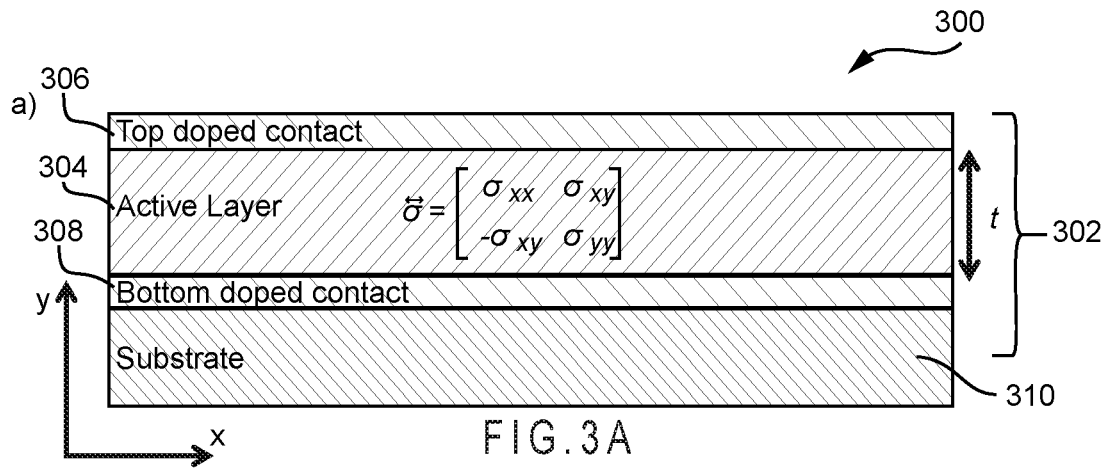
FIG. 3A is a schematic of an example structure of optical device layers and FIG. 3B is a schematic of an example stripline diagnostic structure.
Figure 3B:
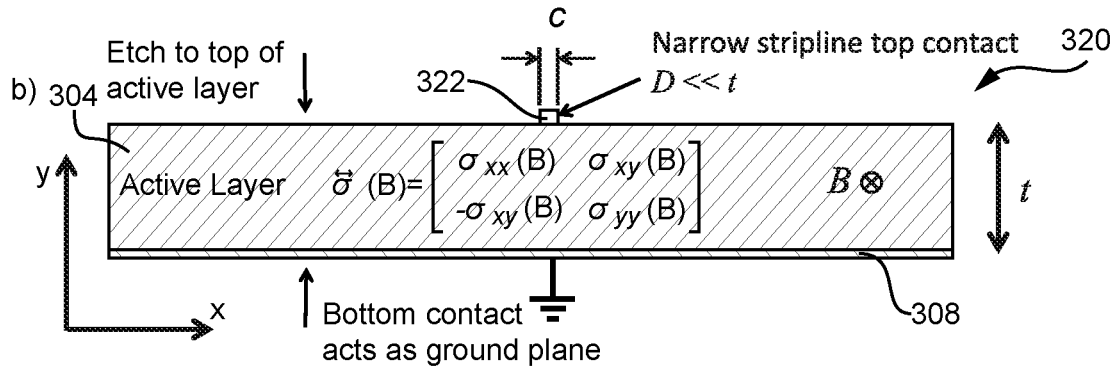

To characterize both the in-plane and cross-plane conductivities of an anisotropic thin film conductor atop a conductive substrate, thin films with a stripline electrode structure described below can be used. FIG. 3A is a schematic of an example structure 300 of optical device layers 302 with an active layer 304 positioned between a conductive top contact 306 and bottom contact 308 on a substrate 310. FIG. 3B is a schematic of an example stripline electrode diagnostic structure 320. The top conducting layer 306 of FIG. 3A is etched away and the bottom conducting layer 308, e.g., back contact, is used as a ground plane. A narrow contact stripline 322 is deposited on the top of the active layer 304. The electromagnetic potential distribution of the stripline structure 320 can be calculated to develop a measurement method of full conductivity tensor.

In one example, optical devices, e.g., infrared (IR) detectors and emitters can include the bottom doped contact 308, the central undoped active layer 304 and the top doped contact 306. A layer of interest is the anisotropically resistive active layer 304 atop the highly conductive bottom contact layer 308. By etching away the top doped contact layer 306, and depositing the narrow metal strip 322 as a top contact, the optical or other device structures can be modified for measurement. The stripline contact 322 width c is much narrower than the thickness t of the active layer 304. The active layer 304 is assumed to have a width much larger than its thickness t, to minimize edge current effects. For simplicity, assume the active layer width is infinite.

Anisotropic conductors, with distinct properties in each direction, can be used in applications including, but not limited to, electronic sensors, field-emission devices and magnetic devices. The electrical transport properties of anisotropic conductors can be characterized by measuring the conductivity tensor. The generic form of the conductivity tensor σ for homogeneous three-dimensional (3D) materials is a symmetric rank-2 tensor (Table 1.1), which contains 6 unique components. The 3D materials can be rotated to align the three principal axes with the x, y and z axes in Cartesian coordinate system, resulting in a diagonalized conductivity tensor with the number of unique components reduced to three. If it is possible to know these principle axes in advance, the material principal axes can be aligned with those of the characterization structure to reduce the number of independent measurements required.

TABLE 1.1

Conductivity tensors for 3D and 2D materials with principle crystalline axes unaligned and aligned with respect to the x, y, z-measurement axes, or aligned in the presence of a magnetic field B. For 2D materials, the magnetic field direction is perpendicular to the plane, B = B·ẑ.

| | arbitrary axes | crystal axes | crystal axes with B |
|---|---|---|---|
| 3D | $\begin{bmatrix} \sigma_{xx} & \sigma_{xy} & \sigma_{xx} \\ \sigma_{xy} & \sigma_{yy} & \sigma_{yz} \\ \sigma_{xz} & \sigma_{yz} & \sigma_{zz} \end{bmatrix}$ | $\begin{bmatrix} \sigma_{xx} & 0 & 0 \\ 0 & \sigma_{yy} & 0 \\ 0 & 0 & \sigma_{zz} \end{bmatrix}$ | $\begin{bmatrix} \sigma_{xx} & -\sigma_{xy} & \sigma_{xz} \\ \sigma_{xy} & \sigma_{yy} & -\sigma_{yz} \\ -\sigma_{xz} & \sigma_{yz} & \sigma_{zz} \end{bmatrix}$ |
| 2D | $\begin{bmatrix} \sigma_{xx} & \sigma_{xy} \\ \sigma_{xy} & \sigma_{yy} \end{bmatrix}$ | $\begin{bmatrix} \sigma_{xx} & 0 \\ 0 & \sigma_{yy} \end{bmatrix}$ | $\begin{bmatrix} \sigma_{xx} & -\sigma_{xy} \\ \sigma_{xy} & \sigma_{yy} \end{bmatrix}$ |

A magnetic field B can be applied to extract more information including the carrier density and mobility, which leads to asymmetric conductivity tensors in arbitrarily aligned materials. For 3D materials with measurement axes aligned to the principal crystal axes, the external B will induce purely anti-symmetric off-diagonal components (Table 1.1, last column). To reduce the complexity of the characterization, a magnetic field can be applied along one principal axis (e.g. B=B$_z$ẑ). In this case, all off-diagonal tensor components with Cartesian coordinates that include the magnetic field direction ($\sigma_{xz}$ and $\sigma_{yz}$) become zero. In addition, many materials have planar symmetry in the x-z plane, so that there are only two unique conductivity tensor components: ($\sigma_{xx}$ and $\sigma_{zz}$). In such cases, the 3D conductivity tensor in the presence of a B-field can be reduced to a 2D tensor (Table 1.1, row "2D"), which enables the separate characterization of the three cross-sections parallel to the principal axes. Therefore, the anisotropic conductivity tensor in the presence of a magnetic field can be represented by a two-dimensional (2D) tensor since the thin-film is isotropic in-plane:

$$\sigma = \begin{bmatrix} \sigma_{xx} & \sigma_{xy} \\ \sigma_{xy} & \sigma_{yy} \end{bmatrix} \quad (2.1)$$

Here the x-axis is the in-plane direction, and the y-axis is the cross-plane direction. The anisotropy ratio is defined as A=$\sigma_{yy}/\sigma_{xx}$. And the 2D anisotropic conductivity tensor is fully described with the three independent components $\sigma_{xx}$, $\sigma_{yy}$ and $\sigma_{xy}$. Even within the simple Drude model, each component depends on the magnetic field (B), with more complicated B-field dependence arising, for example, from contributions from multiple carrier species in multi-carrier materials. For simplicity, the potentials that result from a given conductivity tensor at a fixed B-field are considered.

In one example, to solve for the electrostatic potential of the proposed single-stripline diagnostic structure, mixed Dirichlet and Neumann boundary conditions are used for the bottom and top surfaces of the active layer 304 of interest. The potential and current distribution of the diagnostic structure in galvanomagnetic phenomena is governed by the steady-state Laplace equation with corresponding boundary conditions. The Laplace equation has the same form with or without a magnetic field due to the anti-symmetry of the off-diagonal terms of the conductivity tensor:

$$\nabla \cdot (\sigma \cdot \nabla \varphi) = \sigma_{xx} \frac{\partial^2 \varphi}{\partial x^2} + \sigma_{yy} \frac{\partial^2 \varphi}{\partial y^2} = 0, \quad (2.2)$$

Where φ is the electric potential and the current density is j=−σ·∇φ. The structure is modeled as a 2D infinite strip within −∞<x<+∞, 0≤y≤t. Part of its boundary satisfies Dirichlet boundary conditions where the potential is fixed to zero at the bottom grounding plane and set to the applied voltage V at the central stripline on the top plane:

$$\varphi=0|_{y=0}, \; \varphi|_{x=0,y=t}=V \quad (2.3)$$

Neumann boundary conditions can be defined for the remaining part of the strip boundary where the current density perpendicular to the boundary is either zero or fixed value Iδ(x) at the top stripline.

$$j_y = -\left(-\sigma_{xy}\frac{\partial \varphi}{\partial x} + \sigma_{yy}\frac{\partial \varphi}{\partial y}\right)\bigg|_{y=t} = I\delta(x) \quad (2.4)$$

Here I is the total current resulting from the voltage V applied on the top stripline. For simplicity consider the stripline to have zero-width (c→0) since its width is much smaller than the film thickness (c<<t). According to the $\square_{xy}$ term for the Neumann boundary conditions in Eq. (2.4), although the Dirichlet condition does not change with the magnetic field, the Neumann condition changes under different magnetic field strengths and result in different potential distributions.

Fourier transforms can be utilized to analytically solve the boundary value problem (BVP) determined by Eqs. (2.2)-(2.4). The Fourier transform has several forms, e.g., the unitary from with angular frequency $$\hat{\varphi}(\xi) = \frac{1}{\sqrt{2\pi}} \int_{-\infty}^{+\infty} \varphi(x) e^{-i\xi x} dx$$

and the inverse transform $$\varphi(x) = \frac{1}{\sqrt{2\pi}} \int_{-\infty}^{+\infty} \hat{\varphi}(\xi) e^{+i\xi x} d\xi.$$

Making partial Fourier transform for Eqs. (2.2)-(2.4) with x→ξ(so φ(x, y)↦$\hat{\varphi}$(ξ, y)), to arrive at the modified differential equation:

$$\sigma_{xx}(-\xi^2)\hat{\varphi} + \sigma_{yy}\frac{\partial^2 \hat{\varphi}}{\partial y^2} = 0, \quad (2.5)$$

with boundary conditions:

$$\hat{\varphi}|_{y=0} = 0 \quad (2.6)$$

at the bottom surface, and $$\left(-\sigma_{xy}(+i\xi)\hat{\varphi} + \sigma_{yy}\frac{\partial \hat{\varphi}}{\partial y}\right)\bigg|_{y=L} = \frac{I}{\sqrt{2\pi}} \quad (2.7)$$

at the top.

The solution of potential distribution $\hat{\varphi}(\xi, y)$ to Eqs. (2.5)-(2.7) has the form:

$$\hat{\varphi}(\xi,y) = A(\xi)e^{+\gamma\xi y} + B(\xi)e^{-\gamma\xi y}, \quad (2.8)$$

where $$\gamma = \sqrt{\frac{\sigma_{xx}}{\sigma_{yy}}}..$$

The fact that $\varphi(x, y)$ is purely real requires $\hat{\varphi}(\xi, y)$. Then the Dirichlet boundary condition Eq. 2.6 yields $A(\xi) = B(-\xi)$. Thus the solution in the Fourier regime (Eq. 2.8)) can be rewritten as:

$$\hat{\varphi}(\xi,y) = A(\xi)(e^{+\gamma\xi y} - e^{-\gamma\xi y}) = 2A(\xi)\sinh(\gamma\xi y). \quad (2.9)$$

Since $\hat{\varphi}(\xi, y) = \hat{\varphi}^*(-\xi, y)$, the coefficient $A(\xi)$ satisfies:

$$A^*(\xi) = -A(-\xi) \quad (2.10)$$

Substituting Eq. (2.9) into the Neumann boundary condition Eq. (2.7) can solve for the parameter $A(\xi)$:

$$A(\xi) = \frac{I}{\sqrt{2\pi}} \frac{1/2\xi}{-i\sigma_{xy}\sinh(\gamma\xi L) + \sigma_{yy}\gamma\cosh(\gamma\xi L)}, \quad (2.11)$$

which is verified to satisfy the requirement defined by Eq. (2.10). So the complete form of the potential distribution in the Fourier regime can be derived as:

$$\hat{\varphi}(\xi, y) = \frac{I}{\sqrt{2\pi}} \frac{\sinh(\gamma\xi y)}{-i\sigma_{xy}\xi\sinh(\gamma\xi L) + \sigma_{yy}\gamma\xi\cosh(\gamma\xi L)} \quad (2.12)$$

The potential distribution in the real regime $\varphi(x, y)$, can be obtained by applying the inverse Fourier transform to the $\hat{\varphi}(\xi, y)$. Defining parameters $$A = \frac{I}{\sqrt{2\pi}\,\sigma_{xy}}, \ a = \gamma y, \ b = \gamma\frac{\sigma_{yy}}{\sigma_{xy}}, \ c = \gamma L,$$

Eq. (2.12) can be rewritten as:

$$\hat{\varphi}(\xi, y) = \frac{A}{b^2} \frac{A\sinh(a\xi)(b\cosh(c\xi) + i\sinh(c\xi))}{\xi(1 + B\sinh^2(c\xi))}, \text{ whereby} \quad (2.13)$$

$$\left(B = \frac{b^2+1}{b^2} = 1 + \frac{\sigma_{xx}}{\sigma_{yy}}\right).$$

The inverse Fourier transform of $\hat{\varphi}(\xi, y)$ can be simplified as:

$$\varphi(x, y) = \frac{1}{\sqrt{2\pi}}\int_{-\infty}^{+\infty}\hat{\varphi}(\xi, y)e^{+i\xi x}d\xi \quad (2.14)$$

$$= \frac{1}{\sqrt{2\pi}}\int_0^{+\infty}\hat{\varphi}(\xi, y)e^{+i\xi x}d\xi + \frac{1}{\sqrt{2\pi}}\int_{-\infty}^0\hat{\varphi}(\xi, y)e^{+i\xi x}d\xi$$

$$= \frac{1}{\sqrt{2\pi}}\int_0^{+\infty}\hat{\varphi}(\xi, y)e^{+i\xi x}d\xi + \frac{1}{\sqrt{2\pi}}\int_0^{+\infty}\hat{\varphi}(-\xi, y)e^{-i\xi x}d\xi$$

$$= \frac{1}{\sqrt{2\pi}}\int_0^{+\infty}(\hat{\varphi}(\xi, y) + \hat{\varphi}(-\xi, y))\cos(\xi x) + i(\hat{\varphi}(\xi, y) -$$

$$\hat{\varphi}(-\xi, y))\sin(\xi x)d\xi$$

$$= \frac{1}{\sqrt{2\pi}}\frac{2A}{b^2}\int_0^{+\infty}d\xi \frac{\sinh(a\xi)}{\xi(1 + B\sinh^2(c\xi))}\begin{bmatrix}b\cosh(c\xi)\cos(\xi x) + \\ \sinh(c\xi)\sin(\xi x)\end{bmatrix}$$

So the analytical solution of the potential distribution $\varphi(x, y)$ can be expressed in the integral form:

$$\varphi(x, y) = \frac{1}{\sqrt{2\pi}}\frac{2A}{b^2} \quad (2.15)$$

$$\int_0^{+\infty}d\xi \frac{\sinh(a\xi)}{\xi(1 + B\sinh^2(c\xi))}[b\cosh(c\xi)\cos(\xi x) + \sinh(c\xi)\sin(\xi x)]$$

Recalling that a, b, and c all depend on y the final expression becomes:

$$\varphi(x, y) = \quad (2.16)$$

$$\frac{1}{\pi}\frac{\sigma_{xx}}{\sigma_{yy}\sigma_{xy}}\int_0^{+\infty}d\xi \frac{\sinh\left(\sqrt{\frac{\sigma_{xx}}{\sigma_{yy}}}y\xi\right)}{\xi\left(1 + \left(1 + \frac{\sigma_{xx}}{\sigma_{yy}}\right)\sinh^2\left(\sqrt{\frac{\sigma_{xx}}{\sigma_{yy}}}L\xi\right)\right)} \cdot \left[\sqrt{\frac{\sigma_{yy}}{\sigma_{xx}}}\right.$$

$$\left.\cosh\left(\sqrt{\frac{\sigma_{xx}}{\sigma_{yy}}}L\xi\right)\cos(x\xi) + \sinh\left(\sqrt{\frac{\sigma_{xx}}{\sigma_{yy}}}L\xi\right)\sin(x\xi)\right].$$

Equation (2.16), however, has no analytical solution. Since there exists no straightforward analytical solution of the potential distribution, it can be appropriate to calculate the infinite integral of Eq. (2.16) numerically for one or two points of interest. However, the infinite integral can include a significant amount of time to numerically calculate an array of points in the x-y plane. There can be a more elegant numerical approach to solve for the potential distribution throughout the volume of the anisotropic layer, which involves linear coordinate transformation and finite element method simulation, described below.

Magnetotransport Potential Distribution in Anisotropic Thin Films: Numerical Solution A numerical solution to the potential distribution in the anisotropic thin films can include a different approach than the analytical solution of the previous section. Whereas Hall voltages and resistances of finite 2D structures can be numerically calculated using boundary element methods, finite difference or finite element method (FEM), all these include a finite calculating area, and the majority demonstrated results only on isotropic materials. To solve an anisotropic conductor with infinite lateral dimension, linear coordinate transformations can be used, including a scaling transformation to transform the problem of an infinite anisotropically conducting strip into an isotropic one. Then two conformal maps can be used to transform the infinite isotropic strip into a finite rectangle, which is suitable for numerical calculation. Once these transforms are identified, the infinitely wide strip can be solved by inverting this same set of the transforms.

Coordinate Transformation: Scaling Transformations and Conformal Maps

The boundary condition problem describing the potential $\varphi(x, y)$ for the anisotropic infinite strip (Eq. (2.2)-(2.4)) can be transformed into an equivalent problem in another 2D coordinate system with potential distribution $\varphi'(x', y')$ for an isotropic rectangle. There are two conditions that need to be satisfied for the transformation to preserve the Laplace equation and the boundary conditions. Analogous to the treatment of anisotropic media under zero magnetic field, there can be two conditions:

I) $\varphi(x, y) = \varphi'(x', y')$.
II) The net current flowing through any segment $\Delta L = (\Delta x, \Delta y)$ and its image $\Delta L' = (\Delta x', \Delta y')$ are the same.

Condition I guarantees the potential remains the same on the transformed Dirichlet boundaries. Condition II preserves the current flowing through the Neumann boundaries and the divergence of the current density, so the Laplace equation is still satisfied. These two conditions also ensure that any resistance R is transformed to an identical resistance R'=R in the primed frame.

Scaling Transformation: Anisotropic to Isotropic Infinite Strip

A non-conformal scaling transformation is used to transform the anisotropic conductivity tensor into an isotropic form. The transformation is solved for three-dimensional (3D) form by van der Pauw, but here is solved for the 2D simpler form. A linear transformation $x'=\alpha x$, $y'=\beta y$ so that $\varphi(x, y) = \varphi'(x', y')$ can be performed. This scaling transformation is linear, but it is non-conformal since it does not preserve the local angles in the transformation. The electric field in the new 2D coordinate system is:

$$E'_x = -\frac{\partial \varphi'}{\partial x'} = -\frac{1}{\alpha}\frac{\partial \varphi}{\partial x} = \frac{1}{\alpha}E_x \quad (2.17)$$
$$E'_y = -\frac{\partial \varphi'}{\partial y'} = -\frac{1}{\beta}\frac{\partial \varphi}{\partial y} = \frac{1}{\beta}E_y$$

Condition II requires that:

$$j'_x dy' = j_x dy \Rightarrow j'_x = \frac{1}{\beta}j_x \quad (2.18)$$
$$j'_y dx' = j_y dx \Rightarrow j'_y = \frac{1}{\alpha}j_y.$$

Since $j = \sigma \cdot (-\nabla \varphi)$, Eq. (2.17) and (4.1) lead to:

$$j' = \begin{bmatrix} j'_x \\ j'_y \end{bmatrix} = \begin{bmatrix} \frac{\alpha}{\beta}\sigma_{xx} & \sigma_{xy} \\ -\sigma_{xy} & \frac{\beta}{\alpha}\sigma_{yy} \end{bmatrix} \begin{bmatrix} E'_x \\ E'_y \end{bmatrix} = \sigma' \cdot E' \quad (2.19)$$

When $$\frac{\alpha}{\beta} = \left(\frac{\sigma_{yy}}{\sigma_{xx}}\right)^{1/2} = A^{1/2}, \sigma'$$

reduces to an isotropic conductivity tensor:

$$\sigma' = \begin{bmatrix} \sigma_m & \sigma_{xy} \\ -\sigma_{xy} & \sigma_m \end{bmatrix}, \quad (2.20)$$

where $\sigma_m = (\sigma_{xx}\sigma_{yy})^{1/2}$. Here, adopt $$\alpha = A^{1/2}\frac{\pi}{2}\frac{1}{t} \text{ and } \beta = \frac{\pi}{2}\frac{1}{t},$$

to map the anisotropic infinite strip described in Section 2.1 into an isotropic infinite strip within $$-\infty < x' < \infty, 0 < y' < \frac{\pi}{2},$$

for convenience in the subsequent conformal mapping.

This transformation is not the only non-conformal mapping that can transform the 2D anisotropic conductivity tensor into an isotropic form. The 2D linear transformation can be represented by the transformation matrix $$T = \begin{bmatrix} T_{11} & T_{12} \\ T_{21} & T_{22} \end{bmatrix}$$

so that $$\begin{bmatrix} x' \\ y' \end{bmatrix} = T \cdot \begin{bmatrix} x \\ y \end{bmatrix}.$$

It can be proven that any 2D linear transformation that has:

$$\frac{T_{11}^2 + T_{21}^2}{T_{12}^2 + T_{22}^2} = \frac{\sigma_{yy}}{\sigma_{xx}}, \quad (2.21)$$
$$T_{11}T_{12} + T_{21}T_{22} = 0$$

can transform the boundary condition problem into a coordinate system in which the conductivity tensor is isotropic, as long as $T \neq 0$.

Conformal Map: Infinite Strip to Finite Rectangle

Although the conductivity tensor in the transformed frame is now isotropic, the numerical solution would still require an infinite mesh. Conformal mapping can be used to transform the problem to a finite-sized mesh that can be solved efficiently with the finite element method (FEM). In this case, the infinitely wide stripe in the (x', y') coordinate system can be conformally mapped to a finite rectangle in the (u, v) coordinate system, in which the potential distribution can be calculated with FEM simulation. A conformal map is a linear transformation that preserves local angles and can be used to transform open-boundary shapes (e.g. infinite strip) to closed shapes, which is convenient for solving harmonic functions over a planar domain since the image functions are also harmonic. To simplify the mathematical representation, complex coordinates $z'=x'+iy'$ and w=u+iv can be used to represent the coordinates in the origin and final coordinate systems, respectively, and analytical functions of the complex coordinates used to describe the conformal transformations.

Figure 4A:
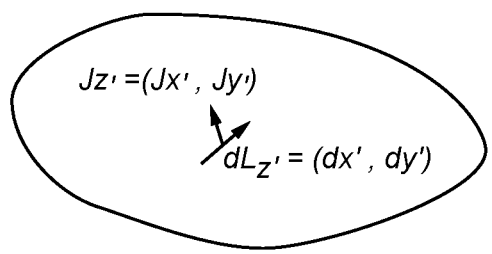
FIGS. 4A-B are schematics of example amounts of current flow before and after the conformal map.
Figure 4B:
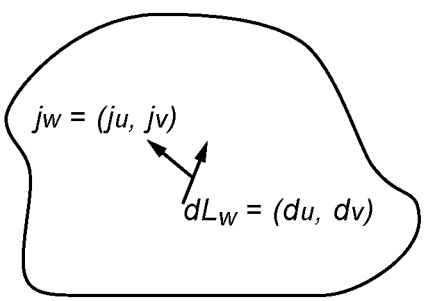

FIGS. 4A-B are schematics of example amounts of current flow before and after the conformal map. The isotropic z' plane is conformally mapped into the w-plane, where the elementary segment $dL_{z'}$ and the current density $j_{z'}$ that passes it are transformed to $dL_w$ and $j_w$, respectively. A total amount of current flowing through $dL_{z'}$ and $dL_w$ are identical. Before applying any conformal maps to further simplify the boundary condition problem in the (x', y') coordinate system, the anti-symmetric conductivity tensor σ' in the primed frame remains invariant under conformal transformation can be shown to satisfy conditions I and II mentioned above. Suppose there is a conformal map from the z'-plane (x', y') to the w-plane (u, v) so that φ'(x', y')=φ(u, v). The conformal map includes:

$$u_{x'} = \frac{\partial u}{\partial x'} = \frac{\partial v}{\partial y'} = v_{y'}, \quad (2.22)$$

$$u_{y'} = \frac{\partial u}{\partial y'} = -\frac{\partial v}{\partial x'} = -v_{x'}.$$

The notation $u_{x'}$ is adopted to represent the partial derivative of u with respect to x'. The current flowing through the segment $dL_{z'}$=(dx', dy') in z'-plane and its image $dL_w$=(du, dv) in w-plane are:

$$dI_{z'} = |j_z \times dL_{x'}| = j_y d_{x'} - j_x d_{y'}$$

$$dI_w = |j_w \times dL_w| = j_u du - j_u dv = (j_v u_{x'} - j_u v_{x'}) dx' - (-j_v u_{y'} + j_u v_{y'}) dy',$$

respectively. From $dI_{z'} = dI_w$ and using the conformal relations of Eq. (2.22) determine the tensor m.

$$j_{x'} = \begin{bmatrix} j_{x'} \\ j_{y'} \end{bmatrix} = \begin{bmatrix} v_{y'} & -u_{y'} \\ -v_{x'} & u_{x'} \end{bmatrix} \begin{bmatrix} j_u \\ j_v \end{bmatrix} = \begin{bmatrix} u_{x'} & -u_{y'} \\ u_{y'} & u_{x'} \end{bmatrix} j_w = m j_w. \quad (2.23)$$

According to the definition of conductivity tensors, $j_z = \sigma'(-\nabla_z \varphi')$, $j_w = \sigma_w(-\nabla_w \phi)$.
From $$\nabla_z \varphi' = \begin{bmatrix} \frac{\partial \varphi'}{\partial x'} \\ \frac{\partial \varphi'}{\partial y'} \end{bmatrix} = \begin{bmatrix} u_{x'} & v_{x'} \\ u_{y'} & v_{y'} \end{bmatrix} \begin{bmatrix} \frac{\partial \phi}{\partial u} \\ \frac{\partial \phi}{\partial v} \end{bmatrix} = \begin{bmatrix} u_{x'} & -u_{y'} \\ u_{y'} & u_{x'} \end{bmatrix} \nabla_w \phi = m \nabla_w \phi, \quad (2.24)$$

identify the conductivity tensor in the w-plane:

$$\sigma_w = (m)^{-1} \sigma' m = \frac{1}{u_{x'}^2 + u_{y'}^2} \begin{bmatrix} u_{x'} & u_{y'} \\ -u_{y'} & u_{x'} \end{bmatrix} \begin{bmatrix} \sigma_m & \sigma_{xy} \\ -\sigma_{xy} & \sigma_m \end{bmatrix} \begin{bmatrix} u_{x'} & -u_{y'} \\ u_{y'} & u_{x'} \end{bmatrix} = \sigma'. \quad (2.25)$$

As a result, the anti-symmetric conductivity tensor remains the same after the conformal mapping from the z'-plane to w-plane. This result can apply any conformal map that simplifies the geometry of the infinite isotropic strip to a finite shape that can be simulated numerically.

FIGS. 5A-C are graphs of example conformal maps transforming the infinite strip from z'-plane (FIG. 5A) to upper half s-plane (FIG. 5B), to a finite rectangle in the w-plane (FIG. 5C). The line along the real axis in the maps represents the Dirichlet boundary at fixed ground potential, and the dot or string of dots represent the Dirichlet boundary at potential V. The circles trace boundary points that map to the corners in the w-plane of the panel in FIG. 5C. The conformal map steps can transform the output of the scaling transformation, an infinite strip in the z'-plane, to a finite rectangle in the w-plane. One step transforms the infinite strip in z'-plane to an infinite semicircle in the upper-half s-plane, and the following step transforms the infinite semi-circle in s-plane into a finite rectangle in w-plane. The first conformal map is:

$$s = \tan h(z'), \quad (2.26)$$

which transforms the infinite strip within $-\infty < x' < +\infty$, $0 \leq y' \leq \pi/2$ in the complex z'-plane (z'=x'+iy') in FIG. 5A into the upper half s-plane in FIG. 5B. The infinite ground plane y'=0 is mapped into the finite segment $-1 \leq p \leq 1$ along the line q=0 and the top point contact at $$z' = i\frac{\pi}{2}$$

is mapped onto infinity in the s plane. The points at the top of the infinite strip at $z' = \pm d + i\pi/2$ (dots in FIG. 5A), map to the s-plane at $s = \pm 1/k$, where k=tan h(d).

The second conformal map is a Schwarz-Christoffel transformation that maps the upper half-plane into a finite rectangle, as in FIG. 5C. A Schwarz-Christoffel mapping is a conformal transformation of the upper half-plane onto the interior of a simple polygon. Consider a polygon in the complex w-plane, there exists a mapping w(s) from the upper half-plane {s∈ℂ :Im s>0} to the interior of a polygon in the w-plane, which maps the real axis of the upper half-plane to the edges of the polygon. If the polygon has interior angles $\phi_1, \phi_2, \ldots, \phi_n$, then the mapping is given by:

$$w(s) = C \int^s (\zeta - \zeta_1)^{-\phi_1/\pi} (\zeta - \zeta_2)^{-\phi_2/\pi} \cdots (\zeta - \zeta_n)^{-\phi_n/\pi} d\zeta, \quad (2.27)$$

where C is a constant, ζ is a real-value integral variable, and $\zeta_1 < \zeta_2 < \ldots < \zeta_n$ are the coordinates of the points along the real axis of the s-plane, which are corresponding to the vertices of the polygon in the w-plane. A specific form of Schwarz-Christoffel mapping can be chosen that maps the upper half-plane in the s-plane to a rectangle in the w-plane:

$$w(s) = -C/k \int_0^s (\zeta + 1/k)^{-1/2} (\zeta + 1)^{-1/2} (\zeta - 1)^{-1/2} \quad (2.28)$$

$$(\zeta - 1/k)^{-1/2} d\zeta \ (0 < k < 1)$$

$$= C \int_0^{\sin^{-1} s} \frac{1}{\sqrt{1 - k^2 \sin^2 \theta}} d\theta$$

$$= CF(\sin^{-1} s, k^2),$$

where $-1/k, -1, 1, 1/k$ are the coordinates of the points on the real axis of s-plane that correspond to the vertices of the mapped rectangle in the w-plane, w-plane, $F(\phi, k^2)$ is the incomplete elliptic integral of the first kind $F(\phi, k^2) = \int_0^\phi (1 - k^2 \sin^2 \theta)^{-1/2} d\theta$ and C is a scaling factor. After the second conformal map, the result is a finite rectangle with vertices ±K and ±K+iK', as shown in FIG. 5C, where K=C F($\pi$/2,k$^2$) and K'=|CF(sin$^{-1}$(1/k),k$^2$)−K... The original infinite ground plane y'=0 in z'-plane (line) in FIG. 5A is mapped to the bottom edge of the rectangle in w-plane, the top point contact at $$z' = i\frac{\pi}{2}$$

is mapped to the center of the top edge of the rectangle (w=iK'), and the points on the top of the infinite strip at z'=±d+i$\pi$/2 are mapped to the top-left and top-right corners of the rectangle in w-plane. By inverting the scaling and conformal maps discussed above, the potential distribution in the anisotropic infinite strip can be easily calculated by first conducting a numerical simulation of the potential distribution in the isotropic, finite rectangle in the w-plane, and then using the inverse transformations to map the result to the desired anisotropic infinite strip in the z-plane.

Finite Element Method (FEM) Numerical Simulation

FIG. 6 is a graph of example triangle meshes generated in the finite rectangle in w-plane for an FEM simulation. The rectangle is divided into small triangle elements using DistMesh. The mesh density is enhanced near the stripline contact and the edges and corners of the rectangle, where the boundary conditions are applied, and a higher resolution is preferred. FEM code based on the open-box Matlab implementation of Courant's P1 triangle elements for the numerical solution of elliptical problems with mixed boundary conditions is used to simulate the potential distribution in an isotropic, finite rectangle. As Shown in FIG. 6, the mesh generating algorithm is modified to produce high-density triangle meshes near contacts, corner, and edges of the rectangle, and high-density triangle meshes near contacts, corner, and edges of the rectangle, and low-density meshes elsewhere, which results in a right balance between accuracy and speed for the following FEM simulation.

FEM: Accuracy and Consistency

Figures 7A, 7B:
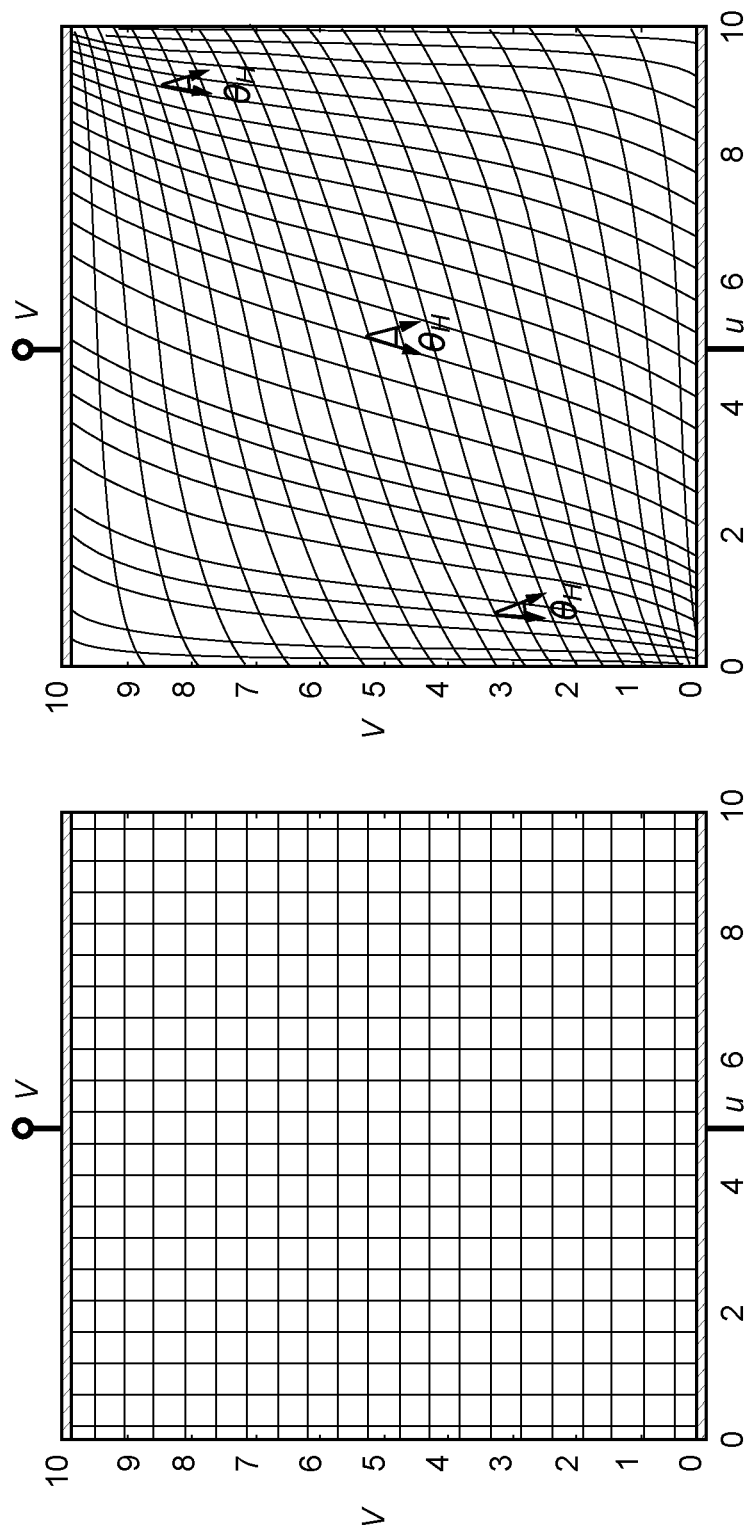
FIGS. 7A-B are graphs of example simulated potential distribution and current flux density in a finite rectangle of isotropic conductor with top and bottom facet contacts, with zero (FIG. 5A) and non-zero (FIG. 5B) off-diagonal component of the conductivity tensor.
Figure 9A:
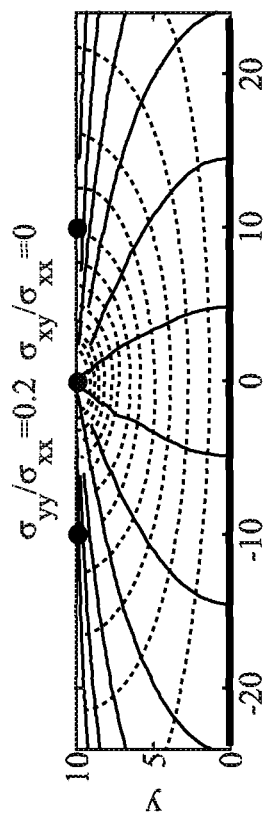
FIGS. 9A-F are graphs of example FEM-determined potential distribution in finite rectangles with isotropic conductivity mapped to the infinite strip with different conductivity anisotropy ratios.
Figure 9B:
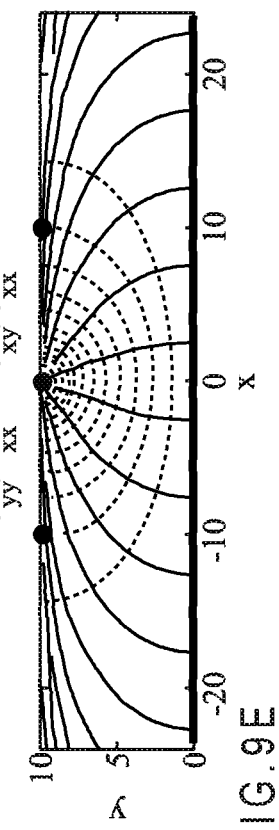
Figure 9C:
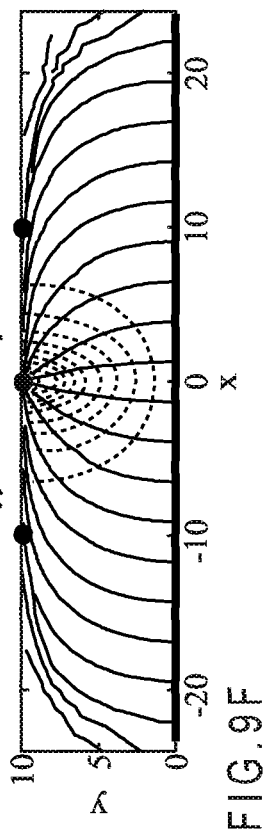
Figure 9D:
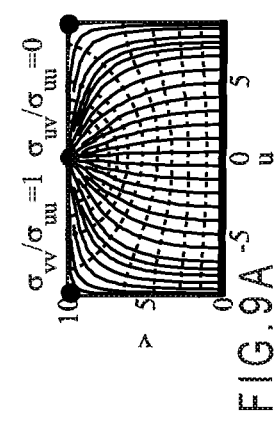
Figure 9E:
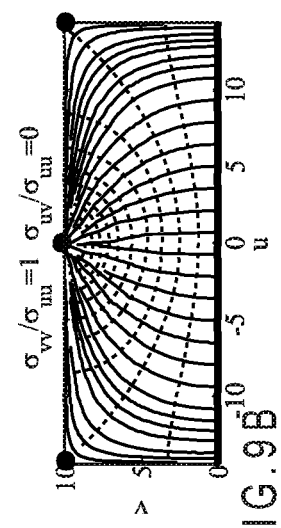
Figure 9F:
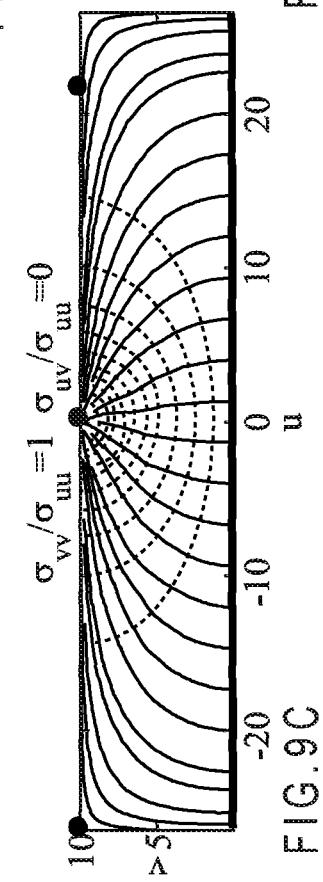

FIGS. 7A-B are graphs of example simulated potential distribution and current flux density in a finite rectangle with top and bottom facet contacts with zero (FIG. 5A) and non-zero (FIG. 5B) off-diagonal component of the conductivity tensor. A Hall angle $\theta_H$=arctan($\sigma_{vv}\sigma_{uuu}$) is formed between the current flux and potential gradient directions. The accuracy of the FEM simulation is studied with a simple diagnostic structure. The potential and current flux distribution is simulated in a finite rectangle with top and bottom facet contacts. In FIG. 7A, in a finite rectangle with top edge fixed at potential $\varphi$=V and bottom edge grounded, the equipotential lines are confirmed to be parallel to the horizontal axis, while the current flux lines are along the vertical axis when the off-diagonal conductivity is zero $\sigma_{uv}$=0 e.g., there is no external magnetic field present. The total current flowing through the rectangle can be analytically calculated with $I_{calc}$=V$\sigma_{uu}$. With FEM simulation, the total current can also be obtained by integrating the calculated current flux density along the top or bottom edge, which yields a numerically simulated value $I_{sim}$. Simulations with various $\sigma_{vv}$ values yield relative error:

$$\left|\frac{I_{sim} - I_{calc}}{I_{calc}}\right| \leq 0.1\%.$$

When $\sigma_{uv}$≠0, e.g., and external magnetic field perpendicular to the uv-plane is present, the equipotential lines and current flux lines are no longer orthogonal, as shown in FIG. 7B. Instead, the current flux and potential gradient directions (the norm of equipotential lines) will form a Hall angle $\theta_H$=arctan($\sigma_{vv}/\sigma_{uuu}$). For example, the Hall angle in FIG. 7B is $\theta_H$=arctan(0.62)≈32°. The potential and current flux distribution in FIG. 7B is consistent with previous numerical study of rectangular-shaped device in the presence of external magnetic field.

Potential Distribution Results

FIGS. 8A-C are graphs of example potential distribution and current flux density of the finite rectangle in the w-plane (FIG. 8A), the upper-half s-plane (FIG. 8B) and the infinitely wide stripe in the z-plane (FIG. 8C). The graphs demonstrate the procedure of calculating the potential distribution in an infinite strip with anisotropic conductivity tensor in the presence of a B-field. Suppose the conductivity tensor in the infinite strip at z-plane has $\sigma_{yy}/\sigma_{xx}$=2, $\sigma_{xy}/\sigma_{xx}$=1, as shown in FIG. 8C. Using the maps, the anisotropic infinite strip can be transformed to a rectangle in w-plane (FIG. 8A), with width $W_u$=32.6 and thickness $t_v$=10, and also an isotropic conductivity tensor ($\sigma_{vv}/\sigma_{uuu}$=1, $\sigma_{uv}/\sigma_{uuu}$=1/$\sqrt{2}$). The electric potential distribution (solid lines) in the isotropic rectangle can be readily calculated with an FEM simulation solving Eq. (2.2) under the boundary conditions described by Eq. (2.3) and (2.4) (FIG. 8A). Using the inverse transformation of the maps described in last section, the potential distribution can be obtained in both s-plane (FIG. 8B) and z-plane (FIG. 8C), and the current flux density (blue lines) can be calculated with the corresponding conductivity tensors. From FIG. 8C, the anisotropic infinite strip, the potential drops at different rate x and y directions, is consistent with the expected conductance anisotropy $\sigma_{yy}/\sigma_{xx}$=2. In addition, both equipotential and current flux lines curve towards the left due to the finite magnetic field indicated by the non-zero Hall conductivity ax, $\sigma_{xy}/\sigma_{xx}$=1 To better understand the separate effects of the conductivity anisotropy and the finite magnetic field, the anisotropy ratio $\sigma_{yy}/\sigma_{xx}$ and the off-diagonal conductivity ratio $\sigma_{xy}/\sigma_{xx}$ can be determined as follows.

FIGS. 9A-F are graphs of example FEM-determined potential distribution in finite rectangles with isotropic conductivity mapped to the infinite strip with different conductivity anisotropy ratios. The anisotropy ratio can be determined under zero magnetic field, where $\sigma_{xy}$=0. The potential distribution of anisotropic infinite strips with anisotropy A=$\sigma_{yy}/\sigma_{xx}$=0.2, 1, 5 is calculated from the FEM simulation of their mapped rectangles in the w-plane, as in FIGS. 9A-F. The aspect ratio W/t of the mapped rectangle in w-plane depends on the anisotropy ratio A through the variable k=tan h(A$^{1/2}\pi$/2):

$$\frac{W_u}{t_v} = \frac{2F(\pi/2, k^2)}{\text{Im}[F(\sin^{-1}(1/k), k^2)]}, \quad (2.29)$$

where Im(z) gives the imaginary part of a complex number z. As in FIG. 9A-C, $W_u/t_v$ increases with the anisotropy ratio A. The potential distribution changes dramatically as the conductivity anisotropy changes. For the isotropic case of FIG. 9B and FIG. 9E (A=1), the equipotential lines start as semi-circles near the top stripline contact and flatten out near the bottom ground plane in FIG. 9E. As the conductivity anisotropy A changes, the equipotential lines deviate from the isotropic case by extending toward the high conductivity direction, e.g., x-direction for A<1 in FIG. 9D and y-direction for A>1 in FIG. 9F, so the potential changes more slowly in the high conductivity direction. The equipotential lines and current flux lines are perpendicular to each other only in the isotropic case (A=1) under zero magnetic field, where the conductivity tensor is effectively reduced to a scaler. For single-carrier materials, under the Drude model, A does not change with magnetic field, whereas for multiple-carrier materials, the anisotropy ratio will become a function of the magnetic field A(B).

FIGS. 10A-F are graphs of example FEM-determined potential distribution for the case of an infinite strip with isotropic conductivity (A=1) is plotted for various magnetic field strengths. The off-diagonal term $\sigma_{xy}$ breaks the symmetry of the potential distribution about the y-axis under a magnetic field, as in FIGS. 10A-F. In one example, an infinite strip with isotropic conductivity (A=1) with subjected to three different magnetic field strengths so that $\sigma_{yy}/\sigma_{xx}=0.2$, 1, 5 respectively. The potential distribution calculated by FEM for the rectangles in w-plane are in FIG. 10A-C, and the potential distribution of the original infinite strips in z-plane is shown in FIG. 10D-F. Both the equipotential and current flux lines are curved toward the bottom left corner of the strip (for an n-type sample assuming electrons dominate the conduction), under the magnetic field in the direction shown. As the ratio $\sigma_{xy}/\sigma_{xx}$ increases, the curvature increases and eventually the current flux concentrates to a so-called "hot spot" on the bottom left corner. The voltage difference between the two points represented by dots are ΔV=0.0001V, 0.2850V, and 0.7296V respectively, and the voltage ΔV does not increase linearly with $\sigma_{xy}/\sigma_{xx}$, unlike conventional Hall bars. This indicates that there exists a longitudinal component in the resistance between these two symmetric points when the magnetic field exists, and as a result, a pure Hall resistance in the isotropic strip cannot be measured without mixing in some longitudinal resistance, due to the ground plane at the bottom shorting out the Hall voltage and causing asymmetric redistributions of the current with increasing B.

Understanding how the potential distribution changes with the conductivity anisotropy (A=$\sigma_{yy}/\sigma_{xx}$) and the non-zero $\sigma_{xy}$ under external magnetic field is the first step towards developing, a possible characterization method to determine the three independent components of the conductivity tensor. Since there are only three independent variables in the 2D anisotropic conductivity tensor ($\sigma_{xx}$, $\sigma_{yy}$ and $\sigma_{xy}$), it can be possible to extract the full conductivity tensor by conducting three independent resistance measurements. However, unlike the conventional Hall bar structure where pure longitudinal conductivities ($\sigma_{xx}$ and $\sigma_{yy}$) can be easily separated from the Hall conductivity ($\sigma_{xy}$), the interrelationship between these independent components here is more complex and requires careful consideration, as described below.

Figure 11:
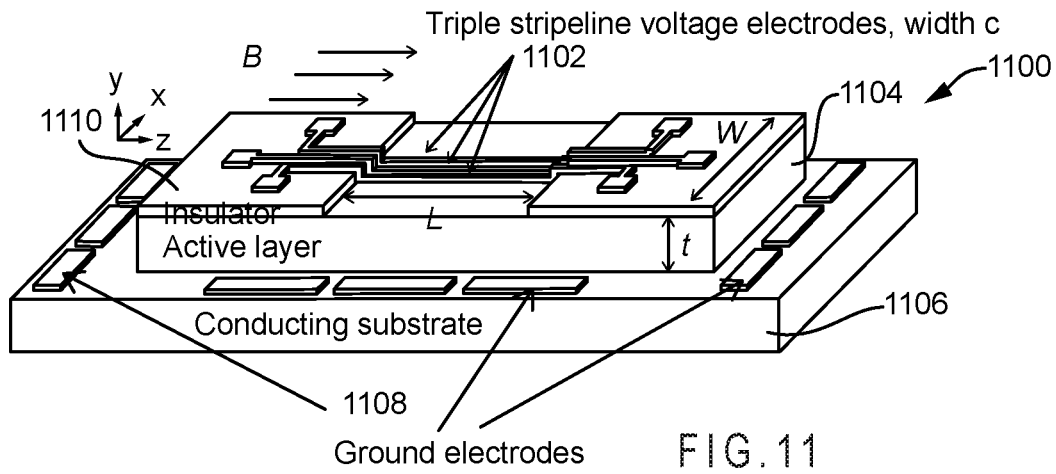
FIG. 11 is a schematic of an example stripline device for measuring independent conductivity components of an anisotropic active layer positioned on a conducting or insulating substrate.

Stripline Electrode Device:

FIG. 11 is a schematic of an example stripline electrode device 1100 for measuring independent conductivity components with stripline electrodes 1102, of an anisotropic active layer 1104 positioned on a conducting or insulating substrate 1106. The stripline electrodes 1102 are deposited on top of the active layer 1104, with a pitch width of the same order as the active layer thickness t and a strip width c much smaller than t. In some example, the stripline device 1100 can include ground electrodes 1108 connected with the conducting or insulating substrate 1106, and a partial insulating layer 1110 positioned between the active layer 1104 and the striplines 1102. Based on the calculated potential distribution of anisotropic thin films atop the conducting or insulating substrate 1106, a characterization method is used to extract the full conductivity tensor via the striplines 1102. In some examples, one stripline 1102 serves as a current source and two other striplines 1102 serve as voltage probes. Other numbers of striplines are possible. The conductivity tensor is extracted by numerically calculating the potential distribution and resistances and comparing the measured resistances with calculation results. The device 1100 can further include materials with large conductivity anisotropy and materials grown on top of the insulating substrate 1110.

In some examples, the diagnostic device 1100 for the triple stripline method includes an anisotropically resistive thin film layer atop a highly conductive bottom contact layer, with the narrow stripline contacts on top, e.g., FIG. 11. Many optical devices, e.g., photodetectors and emitters include a bottom heavily-doped backplane, a central undoped or lightly doped anisotropic superlattice active region and a top heavily-doped surface. By etching away the top layer, then depositing the narrow metal strips 1102 as top contacts, the device can be readily modified to realize the diagnostic structure 1100.

Device Structure and Measurement Setup

Figure 12A:
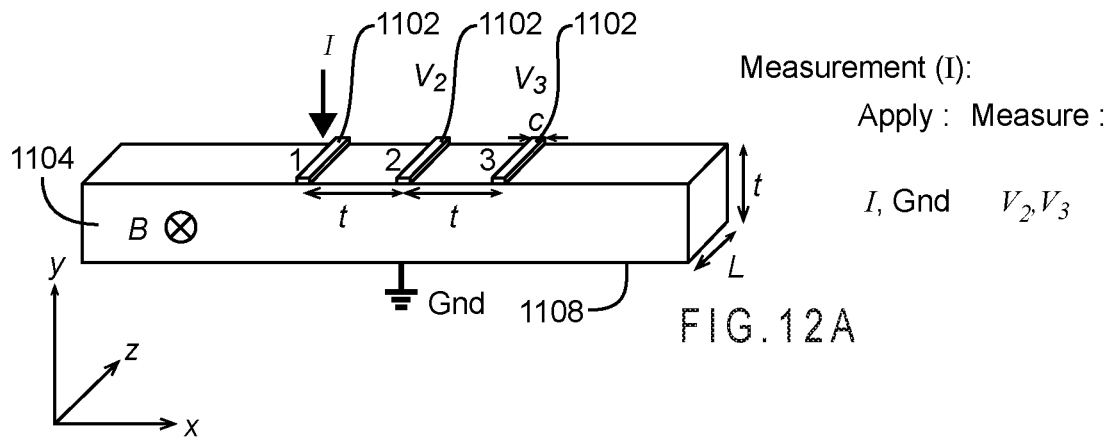
FIGS. 12A-B are schematics of example measurement setups with the device.
Figure 12B:
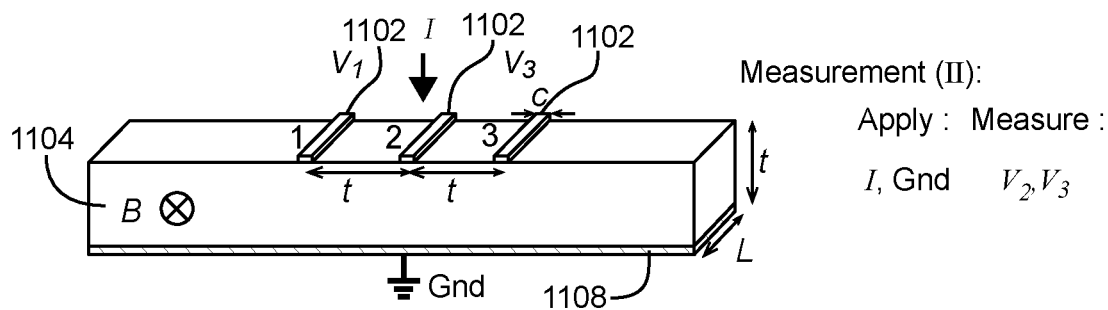

FIGS. 12A-B are schematics of example measurement setups with the device 1100. In FIG. 12A, for measurement (I), current I can be applied to the left stripline contact 1102 (1) and voltages $V_2$ and $V_3$ can be measured relative to ground plane 1108. In FIG. 12B, for measurement (II), current I can be applied to the center stripline contact 1108 (2), and voltages $V_1$ and $V_3$ are measured relative to ground 1108. The device 1100 includes that the stripline contact with c is much narrower than the thickness of the active layer t, so they can be treated as point contacts. The active layer 1104 should have a length L that is much larger than t, e.g., in FIG. 12. At the two ends, the stripline contacts 1102 can extend over an insulating layer to allow larger contact pads for measurement convenience. The pitch between adjacent striplines is chosen to be of the same order as the film thickness P=t, e.g., in FIGS. 12A-B. In one example, measurement (I) in FIG. 12A applies current I from the left-most stripline contact 1102 (1) through the active layer 1104 to the ground plane 1108 contact at the bottom, and measures the potential of the other to stripline contacts 1108 (2) and (3) relative to ground ($V_2$ and $V_3$). Measurement (II) in FIG. 12B applies current I from the center stripline contact 1 to the bottom ground plane 1108, and measures the potential of the two side stripline contacts 1102 (1) and (3) with respect to ground ($V_1$ and $V_3$). In FIG. 11, in some examples there are multiple ground electrodes around the device 1100, so all the measurements are 4-point so that the results are independent of any contact resistances.

The potential distribution of the device 1100 in the two measurements can be determined as described above. For active layer 1104 below the striplines 1102 far from two ends, the potential and current flux distribution is uniform along the z-axis. The potentials $V_i$ (i=1, 2, 3) can be determined for the various configurations with a known anisotropy ratio and a known Hall angle. The process can be inverted by repeating the calculation for a continuum of different anisotropy factors and Hall angles, and then parametrically plotting the result versus the various $V_i$ voltages to be measured. The result enables to extract the conductivity tensor, as described below.

Deducing the Full 2D Conductivity Tensor

The 2D conductivity tensor in the x-y plane for thin films with an external magnetic field includes three independent components. With aligned principal axes and external magnetic field B=Bẑ the conductivity tensor can be re-written as $$\sigma = \begin{bmatrix} \sigma_{xx} & \sigma_{xy} \\ -\sigma_{xy} & \sigma_{yy} \end{bmatrix} \quad (2.30)$$

$$= \sigma_{xx} \begin{bmatrix} 1 & -\sigma_{xy}/\sigma_{xx} \\ \sigma_{xy}/\sigma_{xx} & \sigma_{yy}/\sigma_{xx} \end{bmatrix}$$

$$= \sigma_{xx} \begin{bmatrix} 1 & -\tan\theta_H \\ \tan\theta_H & A \end{bmatrix}.$$

This tensor has three independent components: the anisotropy ratio $A=\sigma_{yy}/\sigma_{xx}$, the tangent Hall angle $\tan\theta_H=\sigma_{xy}/\sigma_{xx}$ and the longitudinal conductivity amplitude $\sigma_{xx}$. The full tensor can therefore be extracted from three independent measurements: $V_2/V_3$, $(V_2-V_3)/I$ in measurement I of FIG. 12A, and $V_1/V_3$ in measurement II of FIG. 12B.

Conductivity Tensor Components Ratios

A first step in identifying the three unknowns in the conductivity tensor is to determine the anisotropy ratio $A=\sigma_{yy}/\sigma_{xx}$ and the tangent Hall angle $\tan\theta_H=\sigma_{xy}/\sigma_{xx}$. From the Laplace equation and boundary conditions governing the potential distribution, the normalized potential distribution only depends on these two ratios, independent of absolute magnitude of the tensor. To determine how these two ratios affect the potential distribution, consider the following two special cases of zero magnetic field but varying anisotropy, and of isotropic conduction with varying magnetic field:

I) No External Magnetic Field ($\sigma_{xy}=0$)

Figure 13B:
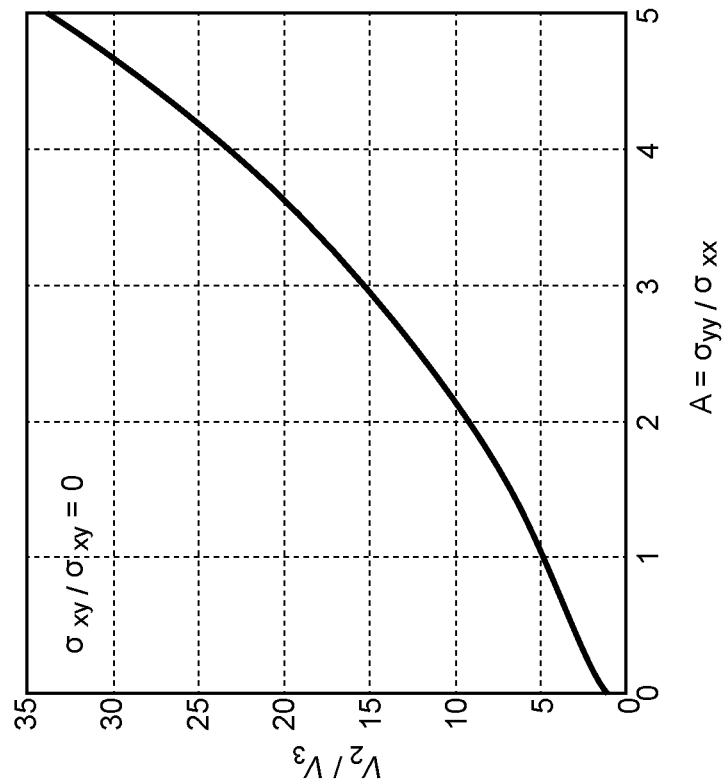
FIGS. 13A-B reproduces the results of FIGS. 9A-F and voltage ratio $V_2/V_3$ for the varying anisotropy ratio.
Figure 13A:
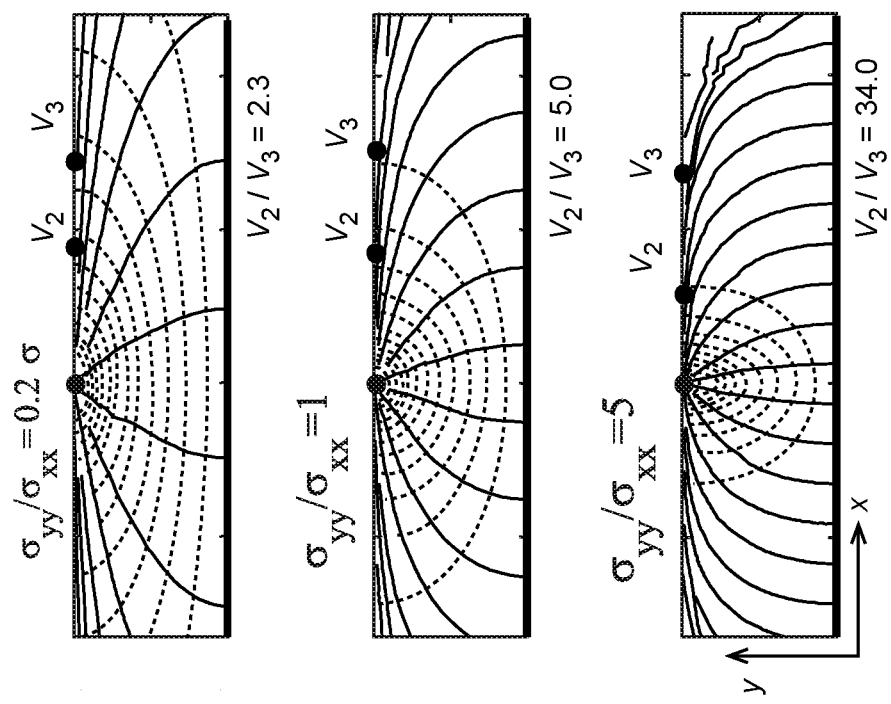

The potential distribution of the infinite anisotropic strip is symmetric around the top current contact in the absence of a magnetic field. FIGS. 13A-B reproduce the results of FIGS. 9A-F for the varying anisotropy ratio $A=\sigma_{yy}/\sigma_{xx}$. To quantify the effect of anisotropy on potential, the ratio $V_2/V_3$ can be measured with measurement I in FIG. 12A. For a small anisotropy ratio A<1, the equipotential lines are horizontally stretched, leading to a low line density along the top edge and thus a small ratio $V_2/V_3=2.3$. As the anisotropy ratio A increases, the equipotential lines become horizontally compressed, resulting in a high line density near the current source along the top edge and a large ratio $V_2/V_3$.

The potential ratio $V_2/V_3$ exhibits a monotonically increasing dependence on the anisotropy ratio $A=\sigma_{yy}/\sigma_{xx}$, e.g., in FIG. 13B. For a given measured potential ratio $V_2/V_3$, the corresponding anisotropy ratio can be readily extracted from the curve. For large anisotropy ratios, the magnitudes of $V_2$ and $V_3$ become very small and the relative measurement error can be large. In practice most anisotropic materials have higher in-plane conductivity than that in the out-of-plane direction, e.g., $\sigma_{yy}/\sigma_{xx}<1$. In this case, the potential ratio $V_2/V_3 \leq 5$ can be measured with a reliable accuracy.

II) Isotropic Material ($A=\sigma_{yy}/\sigma_{xx}=1$)

Figure 14A:
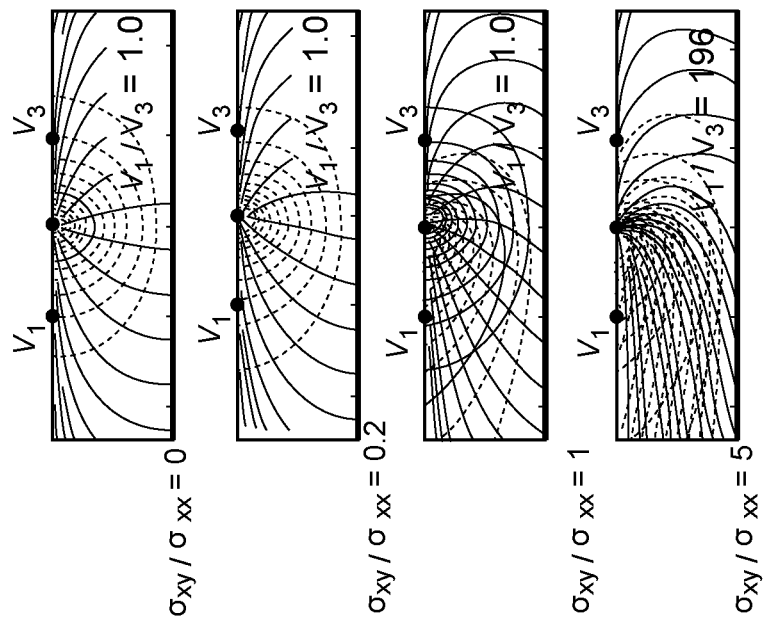
FIG. 14A are graphs of example potential distribution of the infinite strip for isotropic conductivities ($A=\sigma_{yy}/\sigma_{xx}=1$) in varied tan $\theta_H=\sigma_{xy}/\sigma_{xx}$ ratios, which can be induced by different magnetic field strengths, as reproduced from FIGS. 10A-F.
Figure 14B:
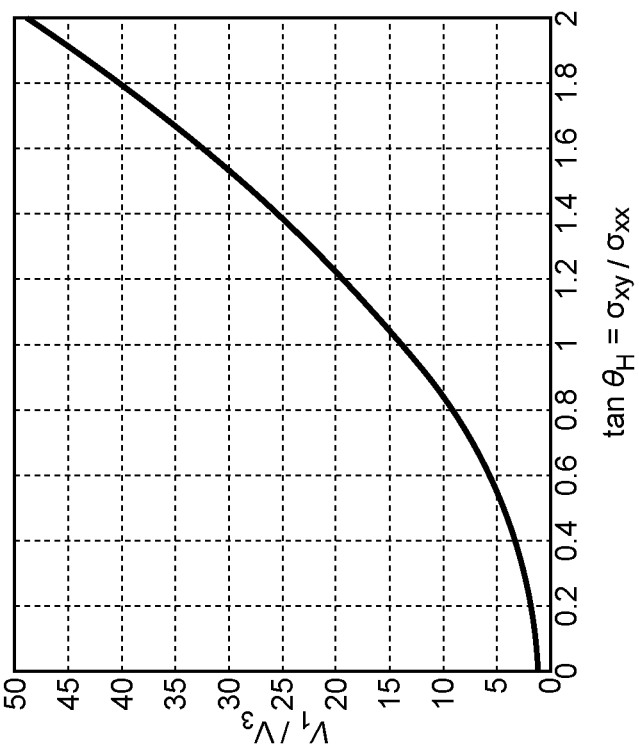
FIG. 14B is an example graph as the calculated voltage ratio $V_1/V_3$ increases monotonically with the tangent Hall angle tan $\theta_H=\sigma_{xy}/\sigma_{xx}$.

The off-diagonal tensor components $\sigma_{xy}$ breaks the symmetry of the normalized equipotential lines around y-axis under a magnetic field. FIG. 14A is graphs of example potential distribution of the infinite strip for isotropic conductivities ($A=\sigma_{yy}/\sigma_{xx}=1$) in varied $\tan\theta_H=\sigma_{xy}/\sigma_{xx}$ ratios, which can be induced by different magnetic field strengths, as reproduced from FIGS. 10A-F. FIG. 14B is an example graph as the calculated voltage ratio $V_1/V_3$ increases monotonically with the tangent Hall angle $\tan\theta_H=\sigma_{xy}/\sigma_{xx}$. In FIGS. 14A-B, as the normalized Hall conductivity $\sigma_{xy}/\sigma_{xx}$ increases, both the equipotential and current flux lines curve towards one side, resulting in an increasing asymmetry.

Unlike a conventional Hall bar structure in which the potential distribution asymmetry is evaluated as a potential difference, the ratio $V_1/V_3$ is used as measured with the second setup in FIG. 12B to reflect the "normalized" potential distribution asymmetry.

Similar to case I), the potential ratio $V_1/V_3$ in the second measurement monotonically increasing with the normalized Hall conductivity $\sigma_{xy}/\sigma_{xx}$, which enables the inverse mapping from the measured $V_1/V_3$ to $\sigma_{xy}/\sigma_{xx}$. However, the increase in $V_1/V_3$ to $\sigma_{xy}/\sigma_{xx}$ is even steeper than that of $V_2/V_3$ with respect to $\sigma_{yy}/\sigma_{xx}$ in FIGS. 13A-B. Thus, the measurement error limits the practical application of the inverse mapping to small normalized Hall conductivity, e.g. $\sigma_{xy}/\sigma_{xx} \leq 1$. Fortunately, this is the low-magnetic field limit, which is readily accessible. For conductors with one single species of carrier, the tangent Hall angle is $\tan\theta_H=\sigma_{xy}/\sigma_{xx}=\mu B$, where $\mu$ is the Hall mobility. So the inverse mapping from $V_1/V_3$ to the normalized Hall conductivity $\sigma_{xy}/\sigma_{xx}$ is most useful in the weak field limit, appropriate to the classical Hall regime.

The inverse mapping from the measured potential ratios ($V_2/V_3$ and $V_1/V_3$) to the respective conductivity parameters (A and $\tan\theta_H$, respectively) for the two special cases discussed above can be generalized to a two-dimensional parametric mapping to deduce the two conductivity parameters for an arbitrary case. The unique relation between the potential ratios and the conductivity tensor components ratios can be expressed as:

$$V_2/V_3 = f_x(\sigma_{yy}/\sigma_{xx}, \sigma_{xy}/\sigma_{xx}),$$

$$V_1/V_3 = f_y(\sigma_{yy}/\sigma_{xx}, \sigma_{xy}/\sigma_{xx}) \quad (2.31)$$

in which $f_x$ and $f_y$ are nonlinear functions of the anisotropy ratio $A=\sigma_{yy}/\sigma_{xx}$ and the tangent Hall angle $\tan\theta_H=\sigma_{xy}/\sigma_{xx}$. If the mapping from $(\sigma_{yy}/\sigma_{xx}, \sigma_{xy}/\sigma_{xx})$ to $(V_2/V_3, V_1/V_3)$ can be proven to be a one-to-one mapping, then there should exist an inverse mapping:

$$\sigma_{yy}/\sigma_{xx} = F_x(V_2/V_3, V_1/V_3),$$

$$\sigma_{xy}/\sigma_{xx} = F_y(V_2/V_3, V_1/V_3) \quad (2.32)$$

Although it may be difficult to analytically prove the inverse relation mathematically, the one-to-one mapping can be verified graphically.

Figure 15:
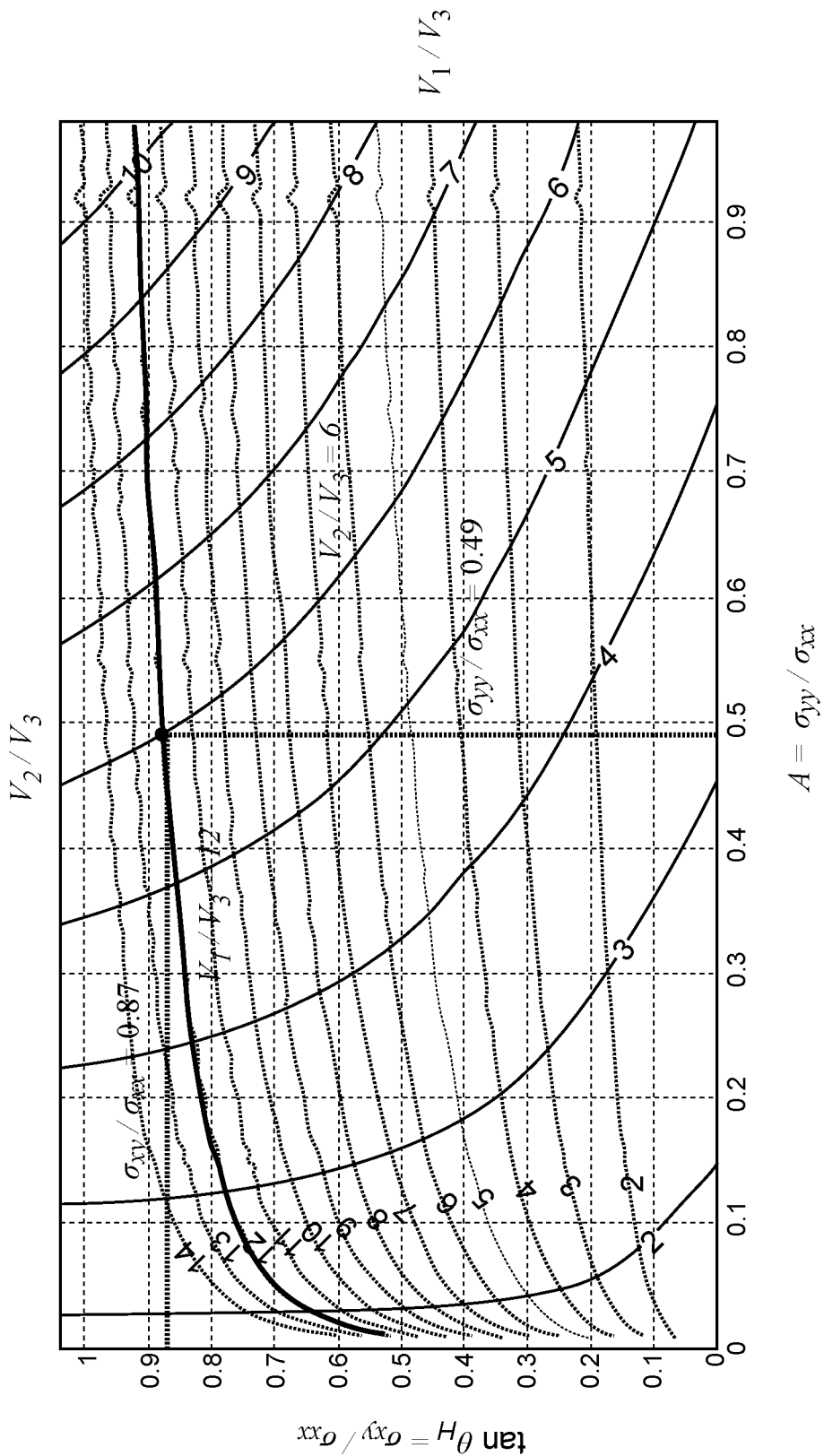
FIG. 15 is an example contour map with example iso-voltage-ratio $V_2/V_3$ (solid lines) and $V_1/V_3$ (dashed lines) plotted on Cartesian coordinates of the tensor components ratios $\sigma_{yy}/\sigma_{xx}$, and $\sigma_{xy}/\sigma_{xx}$.

FIG. 15 is an example contour map with example iso-voltage-ratio $V_2/V_3$ (solid lines) and $V_1/V_3$ (dashed lines) plotted on Cartesian coordinates of the tensor components ratios $\sigma_{yy}/\sigma_{xx}$ and $\sigma_{xy}/\sigma_{xx}$. Each pair of solid and dashed contour lines has one intersection in the first quadrant, indicating the mapping between $(\sigma_{yy}/\sigma_{xx}, \sigma_{xy}/\sigma_{xx})$ and $(V_2/V_3, V_1/V_3)$ is a one-to-one mapping. With known measured potential ratios (e.g. $V_2/V_3=6$, $V_1/V_3=12$), the two corresponding contour lines (solid and dashed lines) can be determined, and their intersection point uniquely indicates the conductivity components ratios ($\sigma_{yy}/\sigma_{xx}=0.49$ and $\sigma_{xy}/\sigma_{xx}=0.87$). It can be observed that for most situations the two sets of contour lines have a finite intersection angle, which promises reliable accuracy for the inverse mapping. For the case of small anisotropy ratio $\sigma_{yy}/\sigma_{xx}<0.05$ the contour lines for $V_1/V_3$ are crowded and become almost parallel with the contour lines of $V_2/V_3$ nearby. The characterization of this extreme case is described below. With this contour map of the potential ratios, the only independent tensor component remaining unknown is the amplitude of $\sigma_{xx}$.

Conductivity Tensor Component Amplitude

Figure 16:
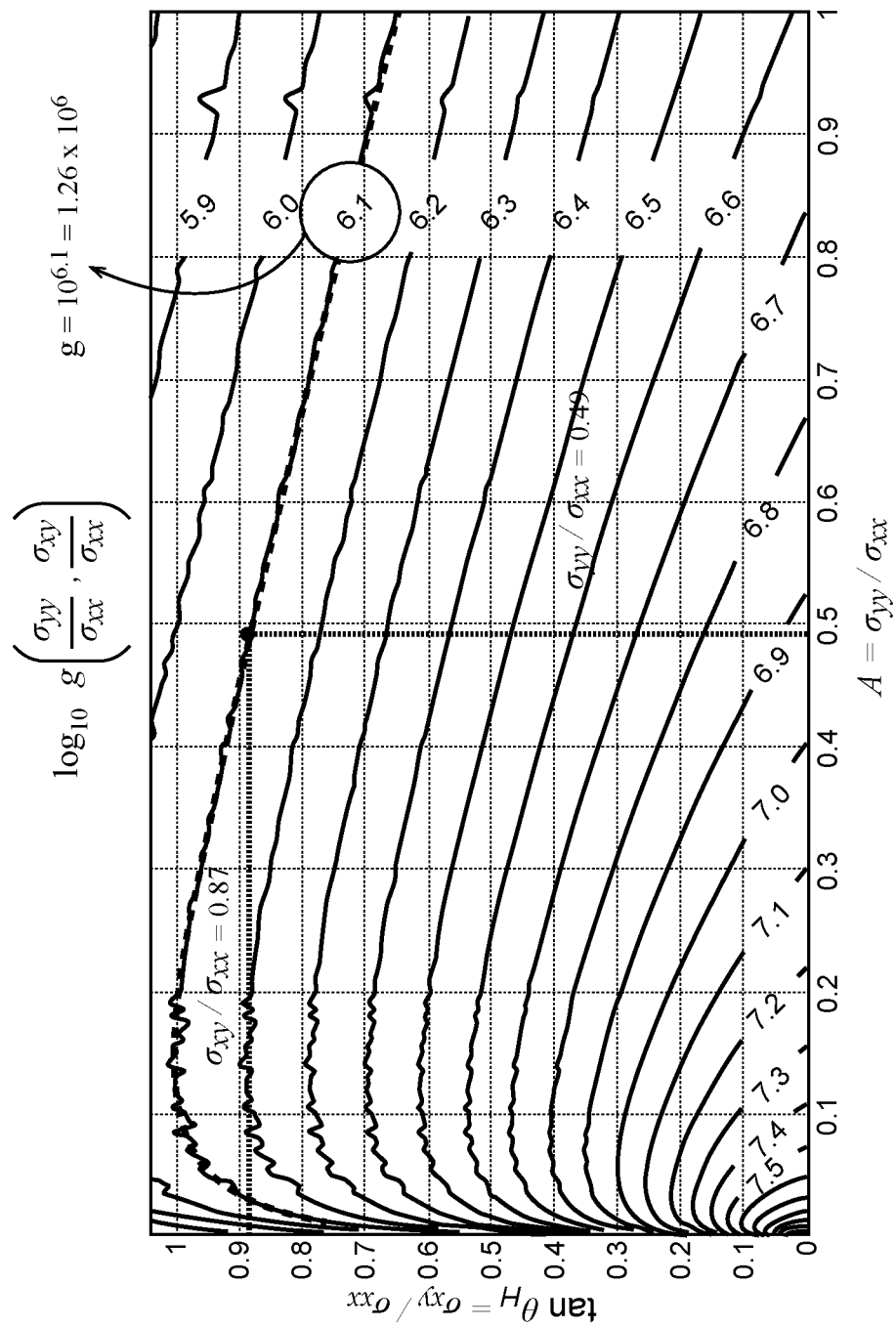
FIG. 16 is an example contour map of the factor g as a function of the conductivity component ratios $\sigma_{yy}/\sigma_{xx}$, and $\sigma_{xy}/\sigma_{xx}$.

FIG. 16 is an example contour map of the factor g as a function of the conductivity component ratios $\sigma_{yy}/\sigma_{xx}$, $\sigma_{xy}/$ $\sigma_{xx}$. The conductivity amplitude represented by $\sigma_{xx}$ can be determined by the potential difference $V_{23}=V_2-V_3$ in the first measurement. It can be shown that:

$$\sigma_{xx} = g(\sigma_{yy}/\sigma_{xx}, \sigma_{xy}/\sigma_{xx}) \frac{I}{V_{23}L}, \quad (2.33)$$

where $g(\sigma_{yy}/\sigma_{xx}, \sigma_{xy}/\sigma_{xx})$ is a unitless scalar. FIG. 16 shows the common logarithm of the numerically calculated factor g as a function of $\sigma_{yy}/\sigma_{xx}$ and $\sigma_{xy}/\sigma_{xx}$. The range of the factor g for small anisotropy ratio ($\sigma_{yy}/\sigma_{xx} \leq 1$) and weak magnetic field ($\sigma_{xy}/\sigma_{xx} \leq 1$) limit is $g \sim 10^6 - 10^7$ when the current I, potential difference $V_{23}$ and stripline length L use SI units. As one example, with the conductivity components ratios $\sigma_{yy}/\sigma_{xx}=0.49$ and $\sigma_{xy}/\sigma_{xx}=0.87$ as determined in FIG. 15, the corresponding factor g is $g=10^{6.1}=1.26 \times 10^6$. A large value of the factor g may amplify the measurement error of the potential difference $V_{23}$, the current I and the stripline length L. Thus, the conductivity tensor component amplitude $\sigma_{xx}$ is expected to have a larger error compared with the components ratios. An in-plane planar device can examine the amplitude of $\sigma_{xx}$ for consistency check if high accuracy is needed.

Expansion of Stripline Device

To expand the stripline device 1100 to regimes other than materials with small conductivity anisotropy in the weak magnetic field limit, and highly conductive substrates, adjusted structures and measurement setups can apply a structure of the stripline device 1100 to thin films with large or small conductivity ratios and thin films with insulating substrates.

Large or Small Conductivity Components Ratios

Figure 17:
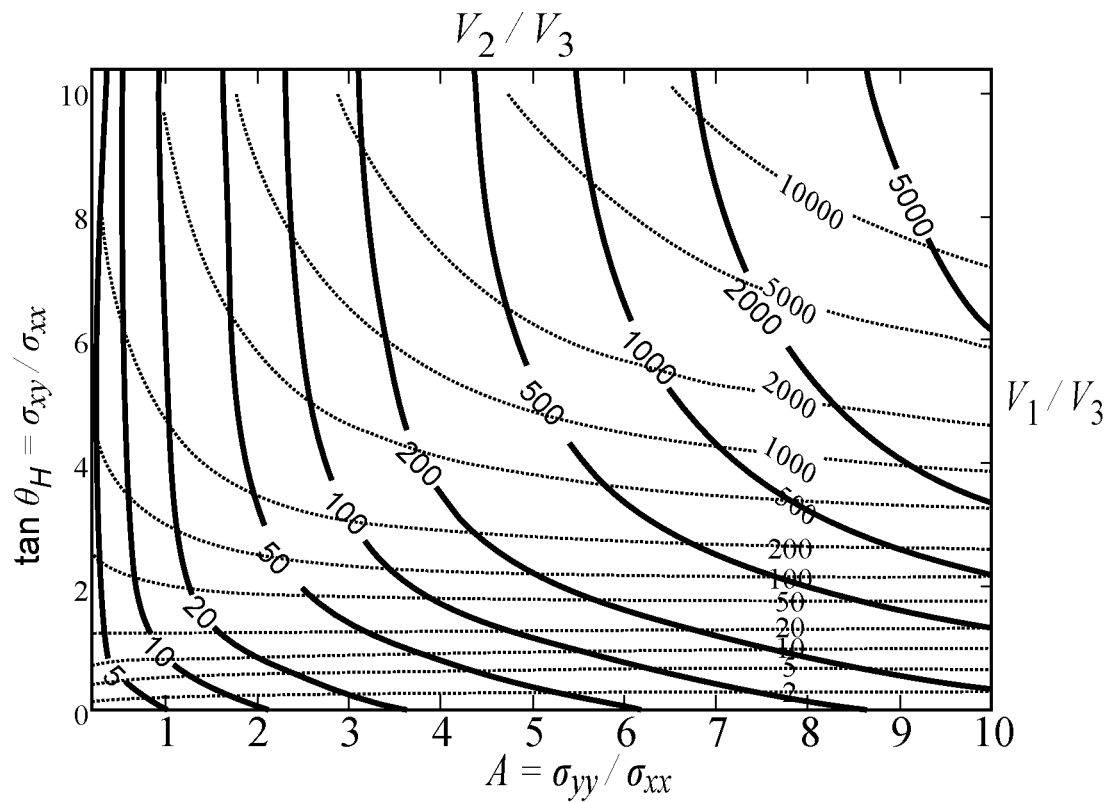
FIG. 17 is an example contour map of $V_2/V_3$ (solid line) and $V_1/V_3$ (dashed line) as a function of the conductivity anisotropy ratio $\sigma_{yy}/\sigma_{xx}$ and the ratio $\sigma_{xy}/\sigma_{xx}$, like FIG. 15, but for a larger range.

A bottleneck limiting the application of the stripline device 1100 to materials with large anisotropy or Hall angles lies in the step of extracting conductivity components ratios $\sigma_{yy}/\sigma_{xx}$ and $\sigma_{xy}/\sigma_{xx}$ from the appropriate plot. FIG. 17 is an example contour map of $V_2/V_3$ (solid line) and $V_1/V_3$ (dashed line) as a function of the conductivity anisotropy ratio $\sigma_{yy}/\sigma_{xx}$ and the ratio $\sigma_{xy}/\sigma_{xx}$, like FIG. 15, but for a larger range. In FIG. 17, increasing the two ratios to 10 results in potential ratios $V_2/V_3$ and $V_1/V_3$ in the order of 103, in which case the amplitudes of the denominator potentials $V_2$ and $V_3$ become extremely small, limiting the practical measurement accuracy. To reduce the relative measurement error, the normalized amplitude of $V_2$ and $V_3$ can be increased.

One solution is to reduce the distance between neighboring stripline contacts. As shown in FIG. 13A and FIG. 14A, as the conductivity ratios increase, the equipotential lines get severely compressed or distorted. To increase the normalized amplitude of $V_2$ and $V_3$, the voltage contacts on the top edge can move closer to the current contact, e.g., the pitch width, or the distance between neighboring striplines is reduced. To preserve the validity of the infinite strip model, the pitch width between neighboring striplines is much larger than the stripline width, which is limited by the fabrication technique of the metal stripline contacts.

Similarly, for extremely small conductivity tensor components ratios, mainly extremely small anisotropy ratio $\sigma_{yy}/\sigma_{xx}$, the equipotential lines are severely stretched in the horizontal direction, resulting in a ratio $V_2/V_3$ close to 1. To solve this problem, the distance between neighboring contacts can be increased. To maintain the infinite strip model, the stripline pitch width is much smaller than the device width W and stripline length L.

In practice, the potential distribution and ratios are calculated for specific device structures to compare with experimental measurement results. The contour map of the potential ratios and the factor g can be calculated for triple stripline structure with increased/decreased stripline pitch width as mentioned above, or even devices with non-equal pitch widths between the metal striplines. Then the full conductivity tensor can be extracted with these calculation results and the two measurements as discussed below.

Insulating Substrate: Penta Stripline

Figure 18A:
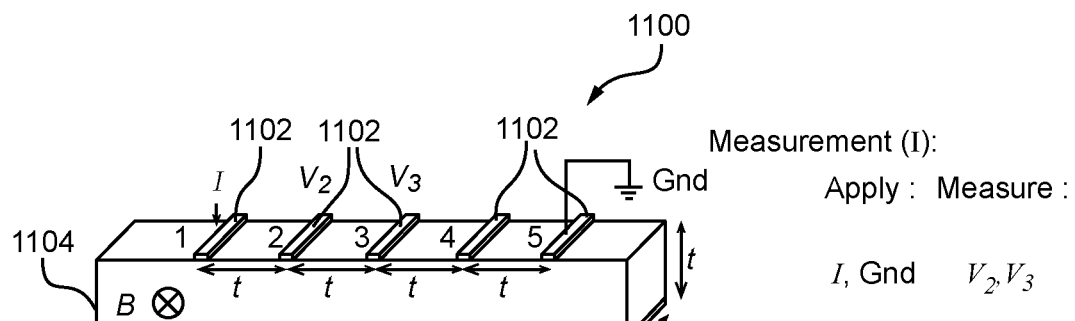
FIGS. 18A-B is a schematic of an example penta stripline device for measuring the conductivity tensor of thin films atop insulating substrate with two measurement steps.
Figure 18B:
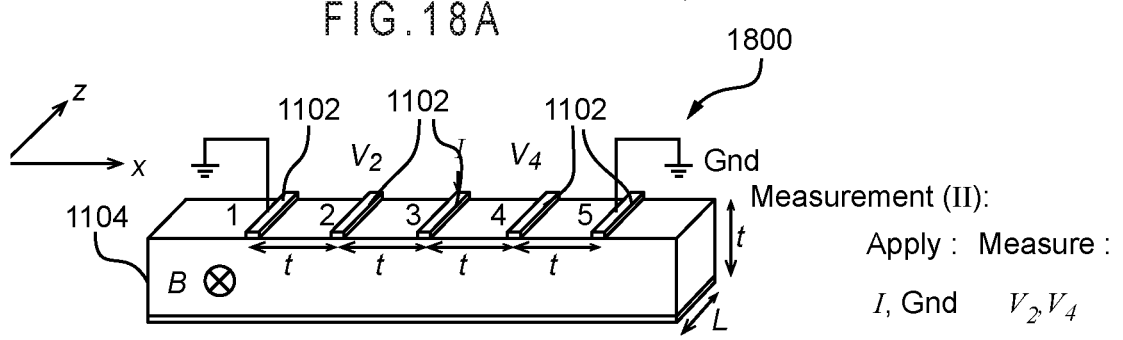

FIGS. 18A-B is a schematic of an example stripline device 1100 for measuring conductivity for thin films atop an insulating substrate with two steps. In FIG. 18A, during step (I), the stripline device 1102 include five striplines 1102 positioned on the active layer 1104. Other numbers of striplines can be used. Current I is applied between two striplines 1102 (1) and (5), where stripline 1102 (5) is grounded, and the four-point voltages at $V_2$ and $V_3$ are measured at striplines 1102 (2) and (3) relative to ground. In FIG. 18B, during step (II), current I is applied between the center stripline 1102 (3) and side striplines 1102 (1) and (5) which are connected to ground, and voltages $V_2$ and $V_4$ are measured at striplines 1102 (2) and (4). For an anisotropic active layer 1104 grown on top of an insulating substrate, the penta stripline device 1100 can be used. In FIGS. 18A-B, in some examples, the penta stripline device 1100 uses five instead of three metal stripline contacts on the active layer 1104. As noted, the two measurement setups can use the side stripline contacts as the ground. With the two potential ratios $V_2/V_3$ from Measurement (I), and $V_2/V_4$ from Measurement (II), and the amplitude of $V_2-V_3$ from the first measurement, the full conductivity tensor can be extracted following similar procedures as the stripline device 1100 in FIG. 11. To enhance the accuracy, in the first measurement, the source current contact and the ground contact can be switched, and the two voltage stripline contacts on the right half of the device ($V_3$ and $V_4$) measured, and then take the average of $V_2/V_3$ and $V_4/V_3$.

Figure 19:
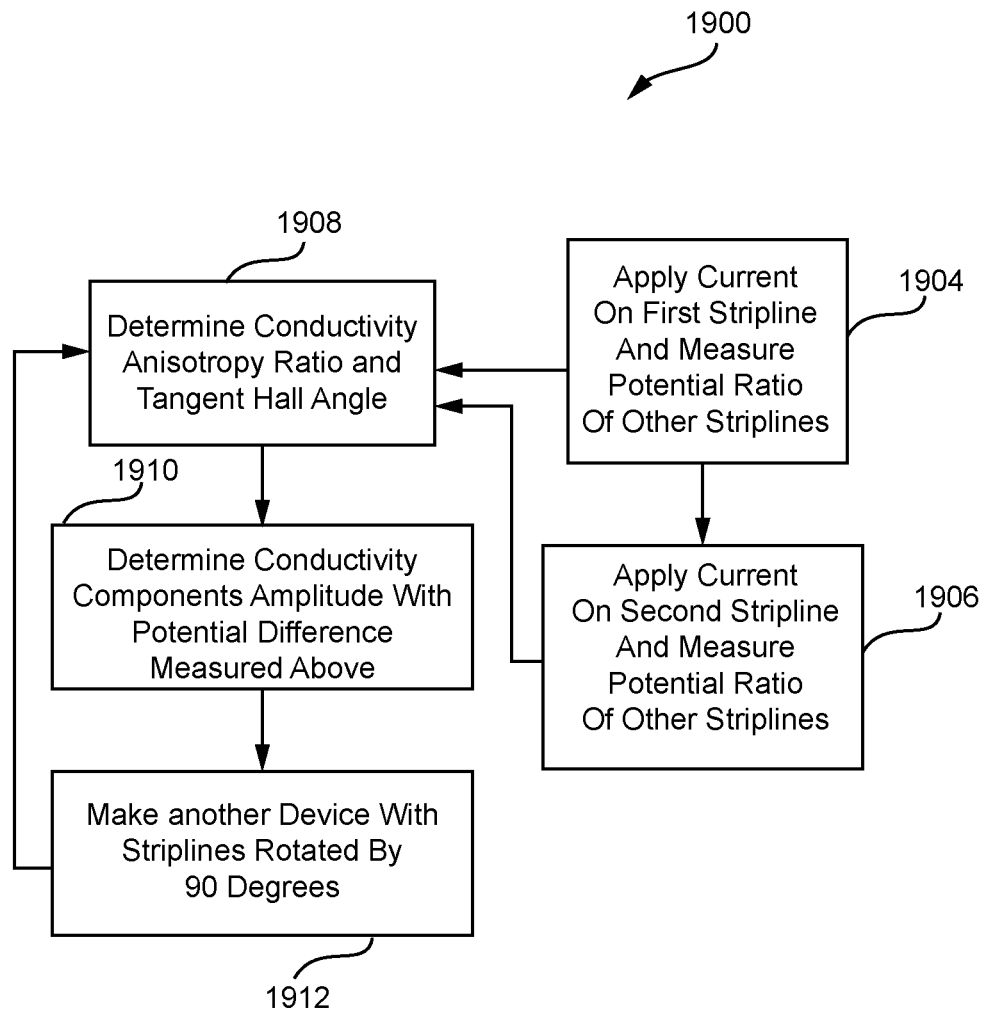
FIG. 19 is a flowchart of example characterization logic to measure conductivity and carrier density.

FIG. 19 is a flowchart 1900 of an example characterization logic to measure conductivity and carrier density. The stripline device 1100 can extract full conductivity tensor with two steps. A first step can be to determine the anisotropy ratio $A=\sigma_{yy}/\sigma_{xx}$ and the tangent Hall angle $\tan\theta_H=\sigma_{xy}/\sigma_{xx}$ from two measurements. Measurement (I) applies the current from a first stripline 1102, e.g., the left-most stripline contact 1, and measures the potential ratio of the other two contacts $V_2/V_3$ (1904). Measurement (II) applies the current from a second stripline 1102, e.g., center stripline contact 2, and measures the potential ratio of the other two contacts $V_1/V_3$ (1906). Then the conductivity anisotropy ratio $\sigma_{yy}/\sigma_{xx}$ and tangent Hall angle $\theta_{xy}/\sigma_{xx}$ can be extracted from the parametric plot of the potential ratios $V_2/V_3$ and $V_1/V_3$ (1908). The second step determines the conductivity amplitude from the numerically calculated factor g and the measured potential difference $V_{23}=V_2-V_3$, as well as the current I and stripline length L in the first measurement (1910). For materials with non-equivalent in-plane principal axes x and z, a second triple stripline device 1100 can be fabricated with the stripline device 1100 rotated around the vertical axis (y) by 90° to characterize the 2D conductivity tensor in the y-z cross-section (1912). Combining the characterization results from two such devices, the electrical transport properties such as the carrier density and Hall mobility in all three directions can be extracted.

While various embodiments have been described, it can be apparent that many more embodiments and implementations are possible. Accordingly, the embodiments are not to be restricted.

We claim:

1. A device for characterizing a thin film, comprising:
   a conducting or insulating substrate;
   an active layer on the conducting or insulating substrate, the active layer including a thickness; and
   a plurality of stripline electrodes on the active layer, and a back contact of the active layer on a side opposite to the plurality of stripline electrodes, the plurality of stripline electrodes including a pitch width of a same order as the thickness of the active layer and strip width smaller than the thickness of the active layer, where one of the plurality of stripline electrodes or the back contact serves as a current source and drain and two of the plurality of striplines electrodes or the back contact serve as voltage probes.

2. The device of claim 1, further comprising an insulator layer disposed between ends of the plurality of stripline electrodes and the active layer.

3. The device of claim 1, wherein the back contact is a ground electrode.

4. The device of claim 1, wherein the active layer is disposed on an insulating layer or a conducting substrate having a ground stripline electrode or ground substrate contact disposed thereon.

5. The device of claim 1, where the active layer comprises an anisotropically resistive thin film layer.

6. The device of claim 1, where the plurality of stripline electrodes comprise at least three stripline electrodes.

7. The device of claim 1, where the active layer includes a length larger than a thickness.

8. A method for characterizing a thin film, comprising:
   providing a conducting or insulating substrate;
   providing an active layer on the conducting or insulating substrate, the active layer including a thickness; and
   providing a plurality of stripline electrodes on the active layer, and a back contact of the active layer on a side opposite to the plurality of stripline electrodes, the plurality of stripline electrodes including a pitch width of a same order as the thickness of the active layer and strip width smaller than the thickness of the active layer, where one of the plurality of stripline electrodes or the back contact serves as a current source and drain and two of the plurality of striplines electrodes or the back contact serve as voltage probes.

9. The method of claim 8, further comprising determining for various stripline electrode configurations, identifying an anisotropy ratio and Hall angle of the active layer.

10. The method of claim 8, further comprising providing an insulator layer disposed between ends of the plurality of stripline electrodes and the active layer.

11. The method of claim 8, wherein the back contact is a ground electrode.

12. The method of claim 8, further comprising extracting a conductivity tensor.

13. The method of claim 8, where the active layer comprises an anisotropically resistive thin film layer.

14. The method of claim 8, where the plurality of stripline electrodes comprise_at least three stripline electrodes.

15. The method of claim 8, where the active layer includes a length larger than a thickness.

16. The method of claim 8, wherein the back contact is a ground electrode.

17. The method of claim 8, where the plurality of stripline electrodes comprise a first stripline electrode, a second stripline electrode and a third stripline electrode, where the method further comprises:
   applying current through the first stripline electrode to the back contact; and
   measuring voltages relative to ground plane of the second stripline electrode and the third stripline electrode.

18. The method of claim 17, where the measurement is independent of any electrode resistances.

19. The method of claim 17, further comprising:
   applying current through the second stripline electrode to the back contact; and
   measuring voltages relative to ground of the first stripline electrode and the third stripline electrode.

* * * * *